(12) United States Patent
Toyao et al.

(10) Patent No.: US 9,269,999 B2
(45) Date of Patent: Feb. 23, 2016

(54) STRUCTURAL BODY, PRINTED BOARD, ANTENNA, TRANSMISSION LINE WAVEGUIDE CONVERTER, ARRAY ANTENNA, AND ELECTRONIC DEVICE

(75) Inventors: Hiroshi Toyao, Tokyo (JP); Noriaki Ando, Tokyo (JP)

(73) Assignee: NEC CORPORATION, Tokyo (JP)

( * ) Notice: Subject to any disclaimer, the term of this patent is extended or adjusted under 35 U.S.C. 154(b) by 678 days.

(21) Appl. No.: 13/254,326

(22) PCT Filed: Apr. 23, 2010

(86) PCT No.: PCT/JP2010/002953
§ 371 (c)(1),
(2), (4) Date: Sep. 1, 2011

(87) PCT Pub. No.: WO2010/125784
PCT Pub. Date: Nov. 4, 2010

(65) Prior Publication Data
US 2012/0032865 A1     Feb. 9, 2012

(30) Foreign Application Priority Data

Apr. 30, 2009  (JP) ................................. 2009-111438

(51) Int. Cl.
*H01Q 1/38* (2006.01)
*H01P 1/20* (2006.01)
(Continued)

(52) U.S. Cl.
CPC ................ *H01P 1/2005* (2013.01); *H01P 3/08* (2013.01); *H01Q 9/42* (2013.01); *H01Q 15/008* (2013.01); *H01Q 15/0086* (2013.01); *H01Q 15/14* (2013.01); *H01Q 21/065* (2013.01);
(Continued)

(58) Field of Classification Search
CPC ....................................................... H01Q 1/38
USPC ............................................................. 343/835
See application file for complete search history.

(56) References Cited

U.S. PATENT DOCUMENTS

2003/0052757 A1    3/2003  McKinzie, III et al.
2004/0001028 A1*   1/2004  Killen et al. .................. 343/795
(Continued)

FOREIGN PATENT DOCUMENTS

CN         101438555 A      5/2009
EP          1860724 A1     11/2007
(Continued)

OTHER PUBLICATIONS

International Search Report for PCT/JP2010/002953 mailed Aug. 3, 2010.
(Continued)

*Primary Examiner* — Dameon E Levi
*Assistant Examiner* — Andrea Lindgren Baltzell

(57) ABSTRACT

A structural body of the invention includes a first conductor plane (1), a plurality of second conductor planes (4) of which at least a portion is provided facing the first conductor plane (1), and a transmission line (6), having an open end, which is disposed between the first conductor plane (1) and the second conductor plane (4), electrically connected to any one conductor plane of the first conductor plane (1) or the second conductor plane (4) through a conductor connection portion (5) and provided facing the other conductor plane. A unit structure including at least the second conductor plane (4), the transmission line (6), and the conductor connection portion (5) is repeatedly disposed.

32 Claims, 36 Drawing Sheets

(51) Int. Cl.
*H01P 3/08* (2006.01)
*H01Q 9/42* (2006.01)
*H01Q 15/14* (2006.01)
*H01Q 21/06* (2006.01)
*H05K 1/02* (2006.01)
*H05K 1/03* (2006.01)
*H01Q 15/00* (2006.01)
*H05K 1/16* (2006.01)

(52) U.S. Cl.
CPC .............. *H05K1/0236* (2013.01); *H05K 1/036* (2013.01); *H05K 1/165* (2013.01); *H05K 2201/0191* (2013.01); *H05K 2201/09318* (2013.01)

(56) References Cited

U.S. PATENT DOCUMENTS

| | | | |
|---|---|---|---|
| 2004/0160367 A1* | 8/2004 | Mendolia et al. | 343/700 MS |
| 2005/0134522 A1 | 6/2005 | Waltho | |
| 2007/0176827 A1 | 8/2007 | Itoh et al. | |
| 2008/0001843 A1* | 1/2008 | Wu et al. | 343/873 |
| 2008/0048917 A1* | 2/2008 | Achour et al. | 343/700 MS |
| 2008/0143607 A1* | 6/2008 | Jung et al. | 343/700 MS |
| 2009/0272206 A1* | 11/2009 | Stumpf | 73/866.5 |

FOREIGN PATENT DOCUMENTS

| | | |
|---|---|---|
| JP | 2002204123 A | 7/2002 |
| JP | 2003529261 A | 9/2003 |
| JP | 2006245984 A | 9/2006 |
| JP | 2006253929 A | 9/2006 |
| WO | 02-103846 A1 | 12/2002 |
| WO | 2005002295 A2 | 1/2005 |

OTHER PUBLICATIONS

J. Liang et al., "Radiation Characteristics of a Microstrip Patch Over an Electromagnetic Bandgap Surface", IEEE Transactions on Antenna and Propagation, vol. 55, No. 6, Jun. 2007, pp. 1691-1697.

L. Yang et al., "A Spiral Electromagnetic Bandgap (EBG) Structure and its Application in Microstrip Antenna Arrays", IEEE, APMC2005 Proceedings, 2005.

Chinese Office Action for CN Application No. 201080019271.1 issued on Jul. 23, 2013 with English Translation.

Chinese Office Action for CN Application No. 2010-80019271.1 mailed on Mar. 27, 2015.

* cited by examiner

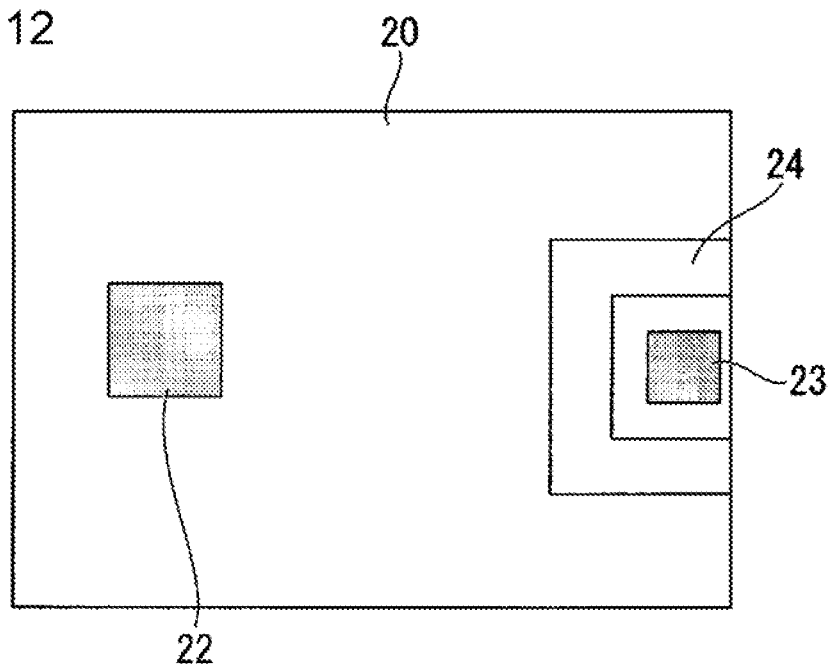

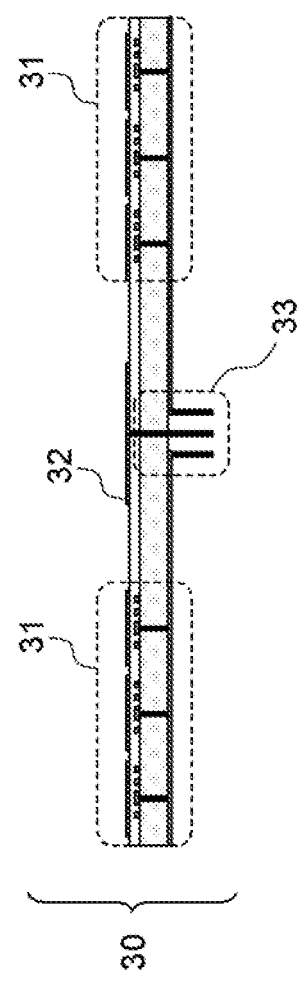

STRUCTURAL BODY, PRINTED BOARD, ANTENNA, TRANSMISSION LINE WAVEGUIDE CONVERTER, ARRAY ANTENNA, AND ELECTRONIC DEVICE

TECHNICAL FIELD

The present invention relates to a structural body, a printed board, an antenna, a transmission line waveguide converter, an array antenna, and an electronic device. Particularly, the present invention relates to a structural body, configured to include a composite right and left handed medium, in which the dispersion relation for electromagnetic waves is controlled, and a printed board, an antenna, a transmission line waveguide converter, an array antenna, and an electronic device which include the structural body.

BACKGROUND ART

In recent years, meta-material techniques have been proposed in which the dispersion relation of electromagnetic waves which propagate using a structural body as a medium is artificially controlled, and technological applications have been examined in a variety of fields. The dispersion relation means a relationship between the wave number (or wavelength) and the frequency of propagating electromagnetic waves. In structural bodies in which a conductor pattern or a conductor structure is periodically arranged, it is possible to control the dispersion relation by appropriately setting the dimensions or the placement, physical properties and the like of various types of elements.

As one meta-material, a transmission line which is a composite right and left handed (simply referred to as CRLH) medium is known. In the CRLH transmission line, it is known that incident electromagnetic waves indicate properties as a right-handed medium, a left-handed medium, and an electromagnetic bandgap structure (hereinafter, simply referred to as an EBG structure) depending on the frequency. The general CRLH transmission line is configured such that a unit structure is periodically disposed one-dimensionally or two-dimensionally. A mushroom-type structure which is one type of unit structure has a structure in which a conductor patch on the surface of a dielectric layer and a conductor plane on the backside of the dielectric layer are electrically connected to each other by a conductor via and the like passing through the dielectric layer.

Incidentally, a structure having a dispersion relation in which the propagation of electromagnetic waves in a specific frequency band is suppressed is called an EBG structure. When the EBG structure is installed on the board such as a printed board or a device package board, it is possible to suppress the propagation of electromagnetic waves generated in the surface of the board, and to reduce, for example, the electromagnetic interference between the antennas or between the devices mounted on the board. It is known that the EBG structure functions as a magnetic wall that reflects incident electromagnetic waves in phase in the vicinity of the bandgap. When the EBG structure is installed on the back side of the antenna using such characteristics, it is possible to realize the low profile of the antenna without lowering the radiation efficiency.

In the CRLH transmission line, capacitance components formed between the adjacent conductor patches constitute an LC parallel resonance circuit along with inductance components formed from the conductor via. The CRLH transmission line has a bandgap in the vicinity of the resonance frequency, and thus can be used as the EBG structure. It is preferable to increase the inductance components in order to shift this bandgap to a lower frequency. However, when the conductor via is made longer in order to increase the inductance components, the thickness of the structure increases.

Techniques capable of solving such a disadvantage include, for example, techniques disclosed in Patent Documents 1 and 2. In Patent Document 1, an intermediate layer in which a planar inductance element such as a spiral inductor is disposed is provided between a conductor patch layer and a conductor plane layer. The inductance element is connected to a patch layer or a conductor plane through the conductor via. The planar inductance element is provided, whereby it is possible to increase the inductance components without increasing the thickness of the EBG structure.

An antenna disclosed in Patent Document 2 is configured to use line-length resonance in the frequency band in which the CRLH transmission line operates as a left-handed medium. In a normal medium (right-handed medium), as the frequency becomes lower, the wavelength of electromagnetic waves becomes longer. Therefore, the size of the antenna structure is increased. In a left-handed medium, as the frequency becomes lower, the wavelength of electromagnetic waves becomes shorter. Therefore, it is possible to miniaturize the antenna by using the CRLH transmission line as a left-handed medium. In Patent Document 2, a slit is provided in the vicinity of the connection portion of the conductor plane and the conductor via and a coplanar line is formed. The coplanar line is provided, whereby it is possible to increase the inductance components without increasing the thickness of the antenna.

RELATED DOCUMENT

Patent Document

[Patent Document 1] Japanese Unexamined Patent Publication No. 2006-253929
[Patent Document 2] Specification of U.S. Patent Application Publication No. 2007/0176827

DISCLOSURE OF THE INVENTION

In the techniques disclosed in Patent Documents 1 and 2, the inductance components can be increased without causing an increase in the thickness, but there is the following problem.

In the structure disclosed in Patent Document 1, two conductor vias of a first conductor via that connects the inductance element to the conductor patch layer and a second conductor via that connects the inductance element to the conductor plane layer are required to be provided for each unit structure. Therefore, the deterioration of the manufacturing efficiency or the increase in the manufacturing costs is caused by a complicated structure, an increase in the number of processes required for manufacturing, and the like.

In the structure disclosed in Patent Document 2, unnecessary electromagnetic waves leak from the slit of the conductor plane provided in order to form the coplanar line, and thus are emitted to the outside of the conductor plane.

The invention is contrived in view of such circumstances, and an object thereof is to provide a structural body which is capable of realizing the reduction in the thickness and the shift to a lower frequency at a low cost, and reducing the unnecessary emission to the backside of the structure. In addition, another object thereof is to provide a printed board, an antenna, a transmission line waveguide converter, an array antenna and an electronic device which include the structural body.

The invention adopts the following configurations in order to achieve the above-mentioned objects.

A structural body of the invention includes: a first conductor;
a second conductor of which at least a portion is provided facing the first conductor; and a transmission line, having an open end, which is disposed between the first conductor and the second conductor, electrically connected to any one conductor plane of the first conductor or the second conductor through a conductor connection portion and provided facing the other conductor, wherein the structural body includes at least one unit structure including at least the second conductor, the transmission line and the conductor connection portion.

A printed board of the invention includes the structural body according to the invention mentioned above.

An antenna of the invention includes the structural body according to the invention mentioned above.

A transmission line waveguide converter of the invention includes the structural body according to the invention mentioned above as a reflective plate.

An array antenna of the invention is configured to dispose a plurality of array elements in the same plane surface using the antenna according to the invention mentioned above as an array element.

An electronic device of the invention includes at least one of the structural body according to the invention mentioned above, the printed board according to the invention mentioned above, the antenna according to the invention mentioned above, the transmission line waveguide converter according to the invention mentioned above, and the array antenna according to the invention mentioned above.

In the invention, it is possible to easily control the operating band of the structural body without causing an increase in the size of the conductor connection portion, and thus it is possible to reduce the thickness of the structural body. Since there is a decreased need to provide the coplanar line from the viewpoint of controlling the operating band, it is possible to reduce the leakage of electromagnetic waves caused by the coplanar line. It is possible to reduce the number of conductor connection portions per unit structure, and thus it is possible to form the low-cost structural body.

As described above, in the structural body of the invention, it is possible to realize the reduction in the thickness and the shift to a lower frequency at a low cost, and to reduce the unnecessary emission to the backside of the structure. The structural body of the invention contributes to the suppression of device noise, and is useful for the reduction in malfunction and the like of the electronic device. The antenna of the invention is useful for the miniaturization of wireless communication equipment and the like that receive electromagnetic waves of the microwave and millimeter wave band.

BRIEF DESCRIPTION OF THE DRAWINGS

The above-mentioned objects, other objects, features and advantages will be made clearer from the preferred embodiments described below, and the following accompanying drawings.

FIG. 12 is a plan view illustrating the printed board according to a modified example of the second embodiment.

FIG. 13(a) is a cross-sectional view illustrating an antenna according to a third embodiment.

DESCRIPTION OF EMBODIMENTS

Figure 1:
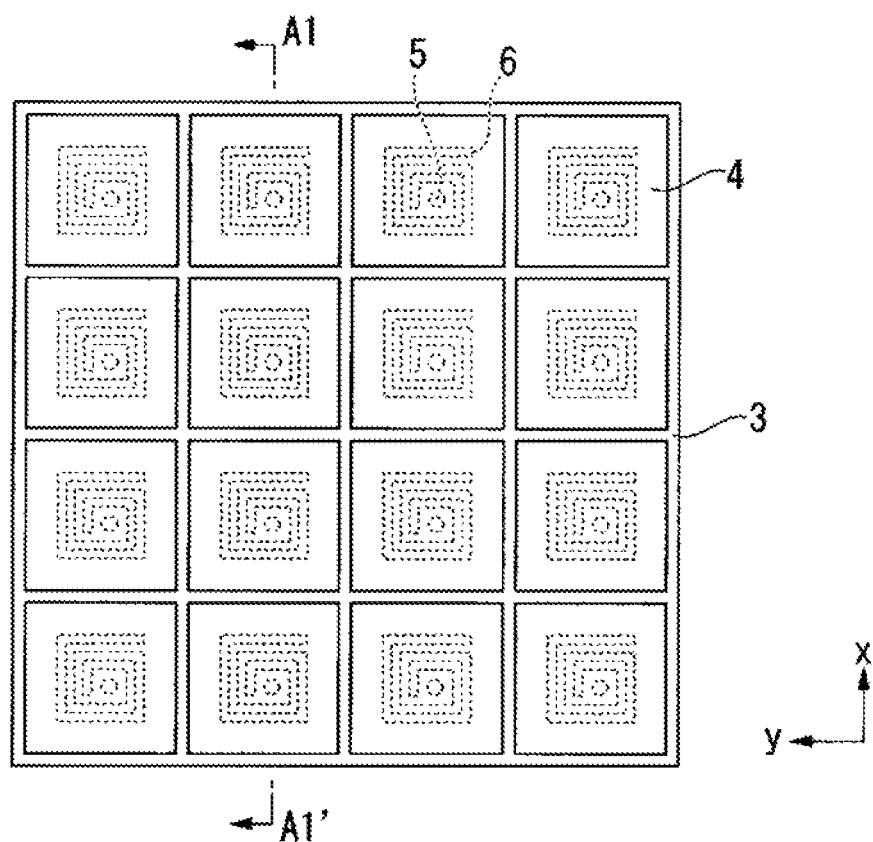
FIG. 1 is a plan view illustrating a structural body according to a first embodiment.

Hereinafter, embodiments of the invention will be described with reference to the drawings. The dimensions or the scale of structures in the drawings may be made different from those of structures in reality, in order to make the featured portions easier to understand. In addition, the positional relationship and the like between the components may be described on the basis of the xyz coordinate system. In this xyz coordinate system, two directions which are at right angles to each other in the plane direction of a first conductor plane are set to an x-axis direction and a y-axis direction, and the normal direction of the first conductor plane is set to a z-axis direction. In the embodiments, like components are referenced by like numerals or signs, and descriptions thereof will not be repeated.

The following structural body includes a composite right and left handed medium (CRLH transmission line) which is one kind of meta-material. In the invention, the dispersion relation of the CRLH transmission line is controlled with a high degree of accuracy, and the structural body of the invention can be operated as a right-handed medium or an EBG structure, and a left-handed medium.

Specifically, the following structural body includes a first conductor, a second conductor of which at least a portion is provided facing the first conductor, and a transmission line, having an open end, which is disposed between the first conductor and the second conductor, electrically connected to any one conductor plane of the first conductor or the second conductor through a conductor connection portion and provided facing the other conductor. The structural body includes at least one unit structure including at least the second conductor, the transmission line and the conductor connection portion.

In such a structural body, an open stub is formed including the second conductor, the transmission line and the conductor connection portion, and a CRLH transmission line including the open stub is formed. The transmission line is provided in the direction of the plane facing the second conductor, whereby the line length of the transmission line is easily adjusted. Therefore, even when the inductance component of the conductor connection portion is not increased, it is possible to easily adjust the admittance of the CRLH transmission line. Consequently, there is a decreased need to increase the length of the conductor connection portion, that is, the distance between one conductor and the transmission line, and thus it is possible to reduce the thickness of the structural body.

In addition, from the viewpoint of an increase in the admittance of the CRLH transmission line, there is a decreased need to provide a coplanar line, and thus there is a decreased need to form a slit, for forming the coplanar line, in one conductor. Therefore, it is possible to reduce the number of slits or eliminate the slit, and to greatly reduce the emission of unnecessary electromagnetic waves to the outside of one conductor through the slit.

In addition, since the CRLH transmission line is constituted by the open stub, it is possible to reduce the number of conductor connection portions per unit structure compared to the CRLH transmission line constituted by a short stub. Therefore, it is possible to form the low-cost structural body capable of reducing the number of processes or the cost required for forming the conductor connection portion.

First Embodiment

Figure 2:
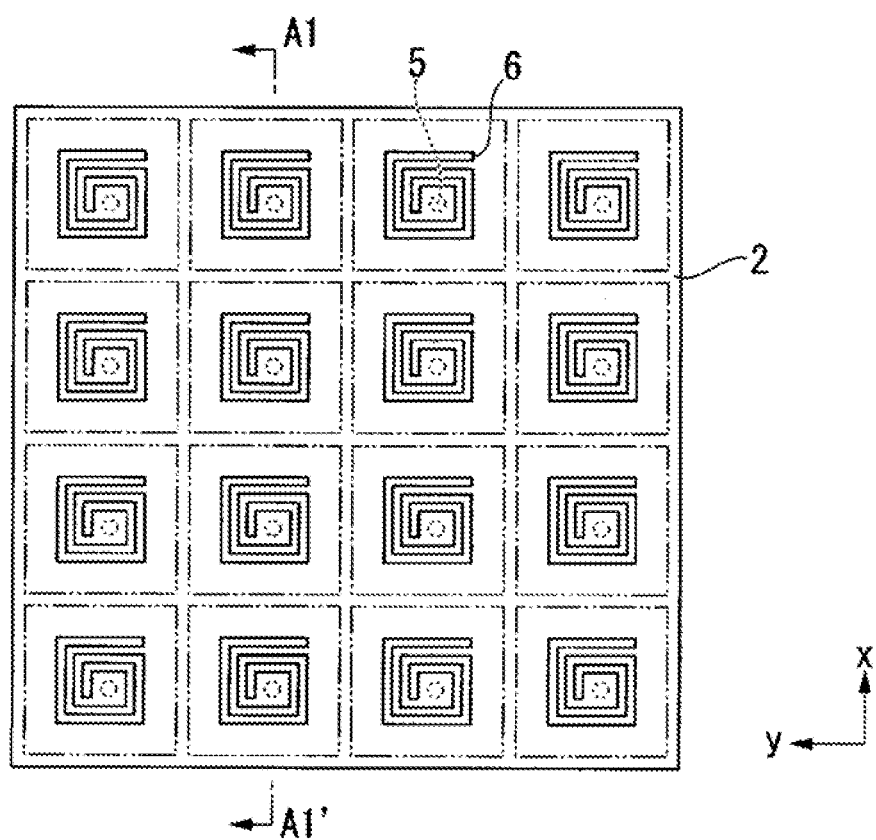
FIG. 2 is a plan view illustrating the structural body according to the first embodiment.
Figure 3:
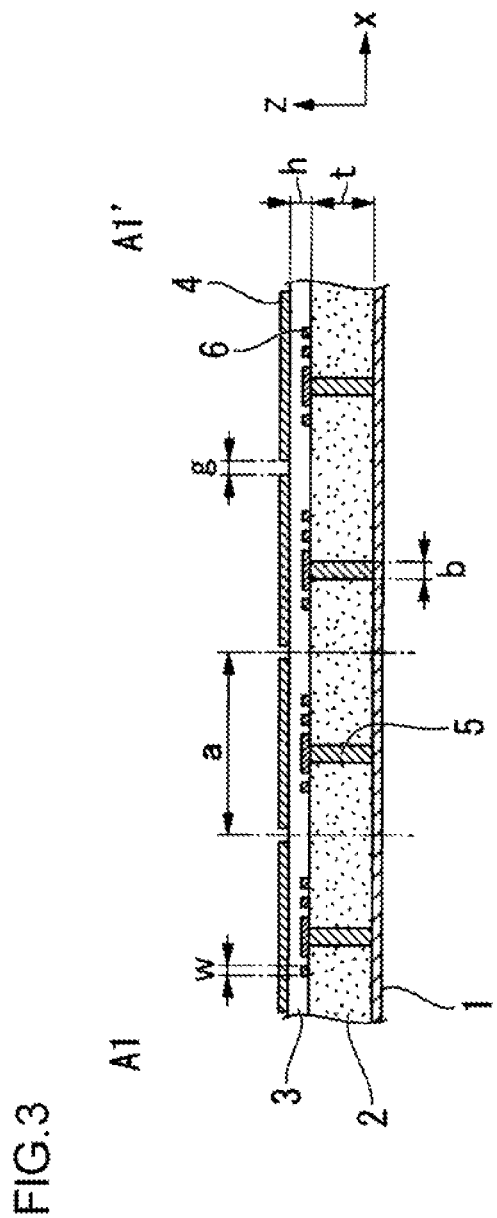
FIG. 3 is a cross-sectional view illustrating the structural body according to the first embodiment.

FIG. 1 is a plan view when the structural body according to the first embodiment is seen from the z-axis forward direction. FIG. 2 is a plan view when the structural body is seen from the z-axis forward direction by seeing through a conductor patch 4 (shown by a chain double-dashed line in FIG. 2) of FIG. 1. FIG. 3 is a cross-sectional view taken along the A-A' line of FIGS. 1 and 2.

As shown in FIG. 3, the CRLH transmission line which is a structural body of the first embodiment includes a conductor plane 1 which is a first conductor, a lower dielectric 2 which is a dielectric layer, an upper dielectric 3 which is a second dielectric layer, a conductor patch 4 which is a second conductive body, a conductor via 5 which is a conductor connection portion, and a transmission line 6. The conductor plane 1 and the conductor patch 4 are all plate-like in shape. The structural body of the first embodiment includes the conductor plane 1 as a lowermost layer, and has a structure in which the lower dielectric 2, the transmission line 6, the upper dielectric 3, and the conductor patch 4 are laminated in this order from the conductor plane 1 toward the upper layer. The conductor via 5 passes through the lower dielectric 2. The transmission line 6 is electrically connected to the conductor plane 1 through the conductor via 5.

As shown in FIGS. 1 and 2, the structural body of the first embodiment has a structure in which the unit structure is repeatedly, for example, periodically disposed two-dimensionally on the conductor plane 1. Meanwhile, the structural body may have a structure in which the unit structure is repeatedly disposed one-dimensionally. The unit structure is a portion including the conductor patch 4. The unit structure includes the conductor via 5 and the transmission line 6 which are disposed in the portion interposed between one conductor patch 4 and the conductor plane 1. Here, the conductor plane 1 is common to a plurality of unit structures. The conductor plane 1 may be provided for each column or for each row of the conductor patch 4. In addition, two or more of a plurality of conductor patches 4 may be integrally provided. Meanwhile, sign a in FIG. 3 denotes the width of a region including one unit structure, sign b denotes the diameter of the conductor via 5, sign g denotes the interval of the conductor patch 4, sign h denotes the thickness of the upper dielectric 3, sign w denotes the line width of the transmission line 6, and sign t denotes the thickness of the lower dielectric 2, respectively.

The conductor patch 4 of the embodiment is roughly square in planar shape. The dimensions in the x-axis direction and the dimensions in the y-axis direction of the conductor patch 4 are smaller than those of the conductor plane 1. The plane direction of the conductor patch 4 is roughly parallel to the plane direction of the conductor plane 1. A plurality of conductor patches 4 is repeatedly, for example, periodically disposed on the plane surface facing the conductor plane 1. Here, a plurality of conductor patches 4 is periodically disposed at regular intervals in the x-axis direction and in the y-axis direction, and is arranged two-dimensionally. The electrical capacitance appropriate to the interval g is formed between two conductor patches 4 which are adjacent to each other in a plurality of conductor patches 4.

The transmission line 6 is disposed between each of a plurality of conductor patches 4 and the conductor plane 1. The upper dielectric 3 is disposed between the transmission line 6 and the conductor patch 4. The transmission line 6 of the embodiment is two-dimensionally provided in the surface facing the conductor patch 4, and is the planar shape thereof is a spiral shape (spiral shape). One end of the transmission line 6 is disposed in the central portion of the spiral shape, and electrically conducts with the conductor via 5 in contact therewith. The other end of the transmission line 6 is disposed in the circumferential portion of the spiral shape, and becomes an open end. That is, in the structural body of the first embodiment, the first conductor plane (conductor plane 1) is selected as any one conductor plane of the first conductor plane (conductor plane 1) and the second conductor plane (conductor patch 2). In this manner, the transmission line 6 is configured to function as an open stub that uses the conductor patch 4 which is the other conductor plane as a return path.

In the structural body according to the embodiment, the unit structure is disposed repeatedly, for example, periodically. The unit structure is constituted by the conductor plane 1, the conductor patch 4, the conductor via 5, and the transmission line 6. The unit structure is repeatedly disposed, whereby the structural body functions as a meta-material.

Herein, when the "repeated" unit structure is disposed, it is preferable that in the unit structures adjacent to each other, the same via distance (center-to-center distance) is set to be within a range of the wavelength λ of ½ of an electromagnetic wave assumed. In addition, a case in which a portion of the configuration is missing in any of the unit structures is also included in "repeated". In addition, when the unit structures have a two-dimensional array, a case in which the unit structures are partially missing is also included in "repeated". In addition, a case in which a portion of the components is out of alignment in some unit structures or a case in which the arrangement of some unit structures themselves is out of alignment is also included in "periodic". That is, even when the periodicity in a strict sense breaks down, it is possible to obtain the characteristics as a meta-material in the case in which the unit structures are repeatedly disposed, and thus a certain level of defects is allowed in "periodicity". Meanwhile, as causes for occurrence of the defects, a case of passing through the interconnects or the vias between the unit structures, a case in which the unit structure cannot be disposed through the existing vias or patterns when the meta-material structure is added to the existing interconnect layout, a case in which manufacturing errors, and the existing vias or patterns are used as a portion of the unit structures, and the like, may be considered.

Next, the characteristics of the structural body of the first embodiment and the basic principle of operation will be described. In the structural body of the first embodiment, a plurality of unit structures arranged repeatedly, for example, periodically, is capacitively coupled to each other, and operates as the two-dimensional CRLH transmission line. Electromagnetic waves corresponding to a bandgap do not propagate through the CRLH transmission line by setting the dimensions or the positions, and the parameters relating to a physical property of various types of elements constituting the unit structure so as to have a bandgap in the dispersion relation. Such a CRLH transmission line functions as an EBG structure. For example, when the EBG structure is provided on the surface of the board, electromagnetic waves having a predetermined frequency band do not propagate through the surface of the board, and thus it is possible to suppress the interference of the electromagnetic waves in the device including the board.

Figure 4:
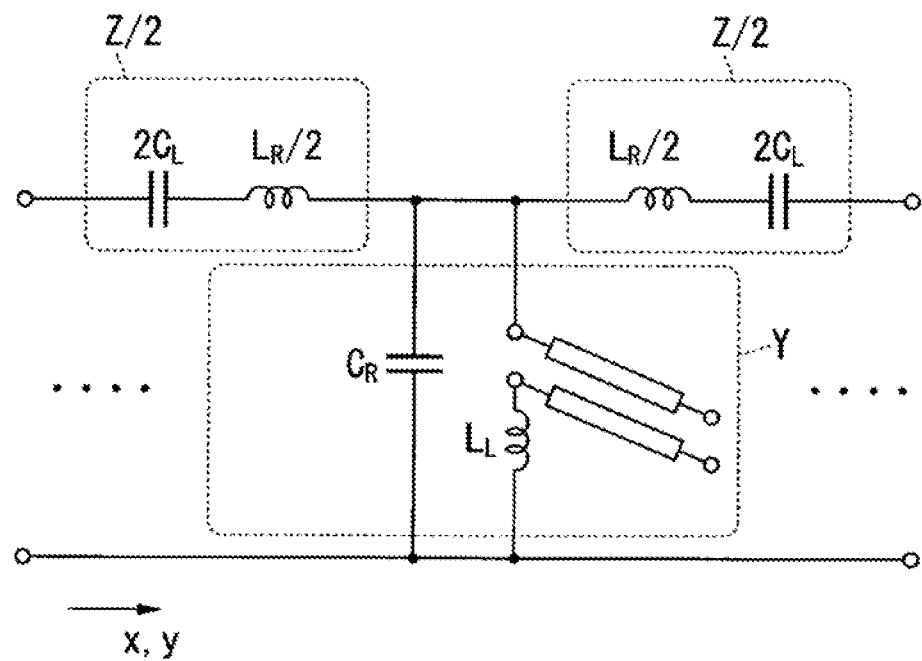
FIG. 4 is an equivalent circuit diagram of the structural body according to the first embodiment.

FIG. 4 is a diagram represented as an equivalent circuit diagram corresponding to an operation related to electromagnetic waves propagating in the x-axis direction or in the y-axis direction with respect to the unit structure of the CRLH transmission line according to the structural body of the first embodiment. $C_R$ of FIG. 4 is a capacitance of a parallel plate constituted by the conductor plane 1 and the conductor patch 4, and $L_R$ is an inductance of the conductor patch 4. $C_L$ denotes a capacitance between two conductor patches 4 adjacent to each other, and $L_L$ denotes an inductance of the conductor via 5. The open stub is constituted by the transmission line 6.

The series impedance Z of the CRLH transmission line is composed of $C_L$ and $L_R$, and is expressed by the following Expression (1) where the angular frequency is set to ω (=2πf). The admittance Y of the CRLH transmission line is composed of $C_R$, $L_L$, and the open stub, and is expressed by the following Expression (2). $Z_{stub}$ in Expression (2) is an input impedance of the open stub, and is expressed by the following Expression (3). In Expression (3), $c_0$ is a speed of light in vacuum, $Z_0$ is a characteristic impedance of the transmission line 6 (the open stub in FIG. 4), d is a line length of the transmission line 6, $\epsilon_{eff}$ is an effective relative dielectric constant of the transmission line 6.

[Expression 1]

$$\frac{Z}{2} = i\omega \frac{L_R}{2} - i\frac{1}{2\omega C_L} \tag{1}$$

[Expression 2]

$$Y = \frac{1}{Z_{stub} + i\omega L_L} + i\omega C_R \tag{2}$$

[Expression 3]

$$Z_{stub} = \frac{iZ_0}{\tan\left(\frac{\omega\sqrt{\epsilon_{eff}}}{c_0}d\right)} \tag{3}$$

In the CRLH transmission line, the imaginary part of the series impedance Z expressed by Expression (1) gives rise to a bandgap in the frequency band having a sign different from that of the imaginary part of the admittance Y expressed by Expression (2) and Expression (3). Therefore, it is possible to set the bandgap to a desired frequency band by appropriately designing the parameters in Expressions (1) to (3).

Next, the dispersion relation of the CRLH transmission line will be described. The dispersion relation corresponds to the relation of the frequency to the wave number (or wavelength) to the electromagnetic waves propagating through the CRLH transmission line. It is possible to calculate the dispersion relation of the CRLH transmission line by applying the periodic boundary conditions to the equivalent circuit of the unit structure of FIG. 4.

Figure 5:
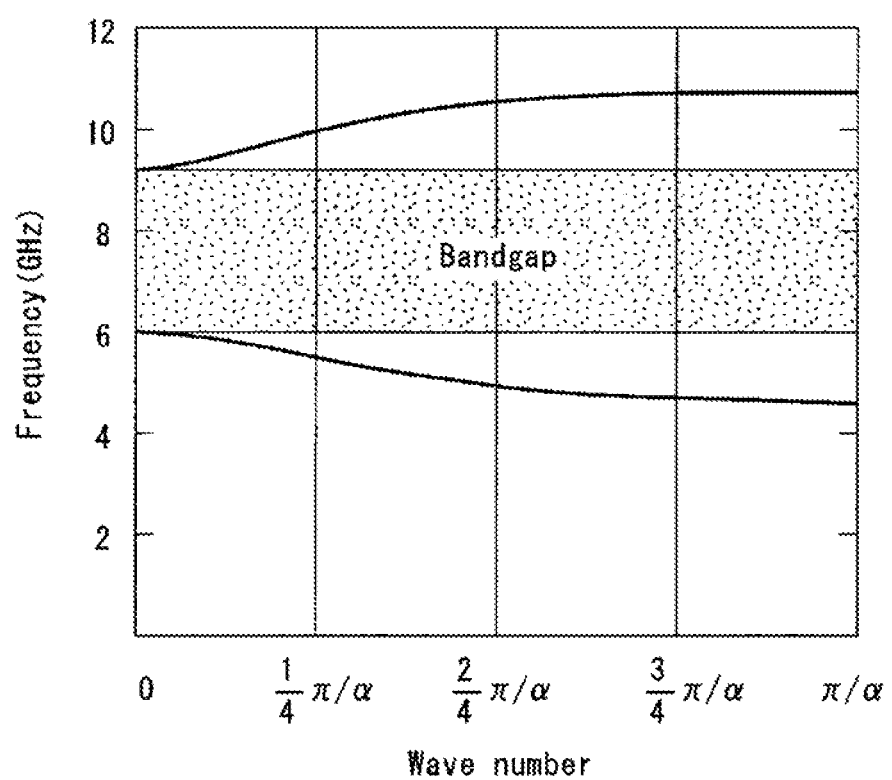
FIG. 5 is a graph illustrating an example of a dispersion relation of a CRLH transmission line according to the invention.

FIG. 5 is a graph illustrating an example of the dispersion relation of the CRLH transmission line according to the invention. Data used in the graph of FIG. 5 are various types of parameters shown in FIG. 3, where the values thereof are set to a=3.5 mm, g=50 μm, t=800 μm, h=100 μm, w=150 μm, and b=250 μm, and the line length d is set to 9 mm, the relative dielectric constants ∈ of the lower dielectric 2 and the upper dielectric 3 are set to 4.188, and the relative magnetic permeability μ is set to 1. In the graph of FIG. 5, the horizontal axis denotes the wave number, and the vertical axis denotes the frequency.

As shown in FIG. 5, the dispersion relation of the CRLH transmission line according to the first embodiment is expressed by a curve falling to the right in the frequency band from 4.6 GHz to 6.0 GHz. Therefore, the CRLH transmission line operates as a left-handed medium in this frequency band. In addition, the dispersion relation is expressed by a curve rising to the right in the frequency band from 9.2 GHz to 10.7 GHz. Therefore, the CRLH transmission line operates as a right-handed medium in this frequency band. En addition, the frequency band from 6.0 GHz to 9.2 GHz between the frequency band operating as a right-handed medium (referred to as a right-handed band) and the frequency band operating as a left-handed medium (referred to as a left-handed band) becomes a bandgap.

The line length d of the open stub is determined by the shape or the dimensions of the transmission line 6. Therefore, when the transmission line 6 is provided two-dimensionally as in the first embodiment, the numerical range capable of being selected as the line length d of the open stub becomes greatly large. Since the degree of freedom in design of the line length d of the open stub is high, it is possible to easily control the dispersion relation of the structural body, and for example, the bandgap is easily set to a desired frequency band.

In the structural body of the first embodiment, as the line length d is made longer, the bandgap is shifted to a lower frequency. Since it is easy to make the line length d longer, it is possible to easily shift the bandgap to a lower frequency. Therefore, from the viewpoint of shifting the bandgap to a lower frequency, there is a decreased need to increase the inductance of the conductor via 5, and thus there is a decreased need to increase the length of the conductor via 5 (the thickness t of the lower dielectric 2). Consequently, it is possible to reduce the thickness t of the lower dielectric 2, and to reduce the thickness of the structural body.

In addition, the open stub is adopted, and only one of the conductor plane 1 and the conductor patch 4 is connected to the transmission line 6. Therefore, as compared to the configuration in which the conductive plate 1 and the conductor patch 4 are all connected to the transmission line 6, it is possible to reduce the number of conductor vias per unit structure, and to simply set the number of conductor vias per unit structure to one. Thereby, it is possible to simplify a process of forming the conductor via, and to form a low-cost structural body.

In addition, it is possible to control the admittance Y by the open stub, and to easily control the admittance Y by adjusting the line length d. Therefore; there is a decreased need to control the admittance Y by providing the coplanar line, and thus there is a decreased need to provide the slit for forming the coplanar line. Consequently, it is possible to reduce the number of slits or eliminate the slits, and thus the emission of unnecessary electromagnetic waves to the outside of the conductor plane 1 through the slit is greatly reduced.

Figure 6:
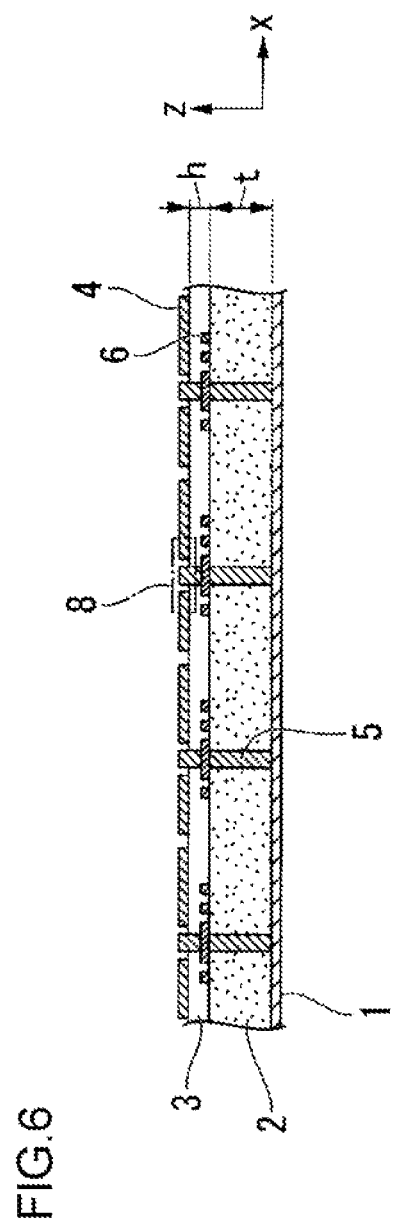
FIG. 6 is a cross-sectional view illustrating the structural body according to a modified example of the first embodiment.

Meanwhile, in the first embodiment, although the configuration in which the conductor via 5 does not pass through the upper dielectric 3 is exemplified, the conductor via 5 is not limited to this form so long as the conductor plane 1 is electrically connected to the transmission line 6, and the form of the conductor via 5 can be appropriately modified. For example, as shown in FIG. 6, the configuration in which the conductor via 5 passes through the upper dielectric 3 may be adopted, and it is possible to obtain the effect of the invention even by this configuration. When the conductor via 5 is a through via passing through the upper dielectric 3, in order to electrically insulate the conductor via 5 and the conductor patch 4 from each other, it is preferable to form an opening having a diameter larger than the diameter of the conductor via 5 in the periphery of the conductor via 5 in the conductor patch 4, and to provide a clearance 8.

When the through via is adopted, the structural body may be manufactured as follows. First, after a laminated body other than the conductor via 5 is formed, an opening is formed in the conductor patch 4 by a well-known processing method, for example, etching and the like. Next, a through-opening leading to the conductor plane 1 through the upper dielectric 3, the transmission line 6, and the lower dielectric 2 is formed by a well-known processing method, for example, drilling and the like. The diameter of a through-hole is set to be smaller than that of the opening of the conductor patch 4. The conductor via 5 made of a conductor is formed by burying a conductor within the through-hole. In this way, since the conductor via 5 is formed after a process in which the components are laminated is terminated, it is possible to more efficiently manufacture the structural body at a low cost compared to the method in which the laminating process is stopped and the conductor via 5 is formed.

Figure 7:
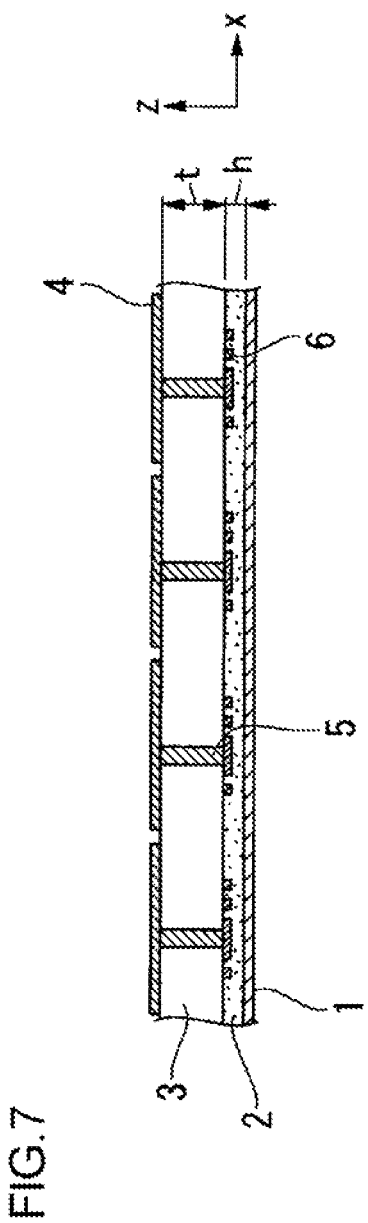
FIG. 7 is a cross-sectional view illustrating the structural body according to the modified example of the first embodiment.

In the first embodiment, although the configuration in which the transmission line 6 is connected to the conductor plane 1 through the conductor via 5 is exemplified, the configuration may be applied in which the transmission line 6 is connected to the conductor patch 4 through the conductor via 5 as shown in FIG. 7. This configuration is a configuration in which the conductor patch 4 is selected as any one conductor plane of the first conductor plane (conductor plane 1) and the second conductor plane (conductor patch 4). The transmission line 6 functions as the open stub that uses the conductor plane 1 which is the other conductor plane as a return path, and this structural body also operates in the same manner as that of the first embodiment.

In addition, the shape and the dimension of the transmission line 6 is not limited so long as the transmission line 6 is electrically connected to any one conductor plane of the first conductor plane or the second conductor plane and faces the other conductor plane. Hereinafter, a modified example relating to the shape and the like of the transmission line 6 will be described.

Figure 8:
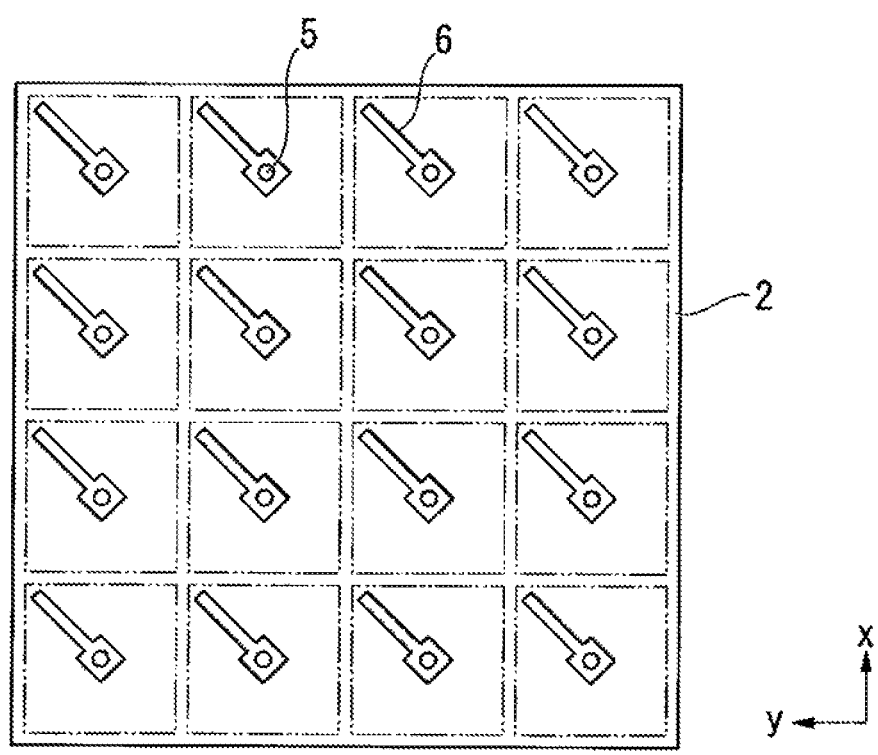
FIG. 8 is a plan view illustrating the structural body according to the modified example of the first embodiment.

In the first embodiment, although the configuration in which the transmission line 6 is formed in a spiral shape is exemplified, the configuration in which the transmission line 6 is formed in a substantially linear shape may be applied, for example, as shown in FIG. 8. In the transmission line 6 shown in FIG. 8, one end thereof two-dimensionally overlaps the substantially central portion of the conductor patch 4, and the other end thereof two-dimensionally overlaps one of the corner portions of the conductor patch 4. The transmission line 6 is electrically connected to the conductor via 5 in one end thereof. The shape of the transmission line 6 may be a meandering shape or the like in addition to a spiral shape or a linear shape. In addition, the placements or the shapes of the transmission line 6 may be different from each other in a plurality of unit structures. For example, the unit structure in which the spiral-shaped transmission line 6 is disposed and the unit structure in which the linear-shaped transmission line 6 is disposed may be mixed.

Figure 9:
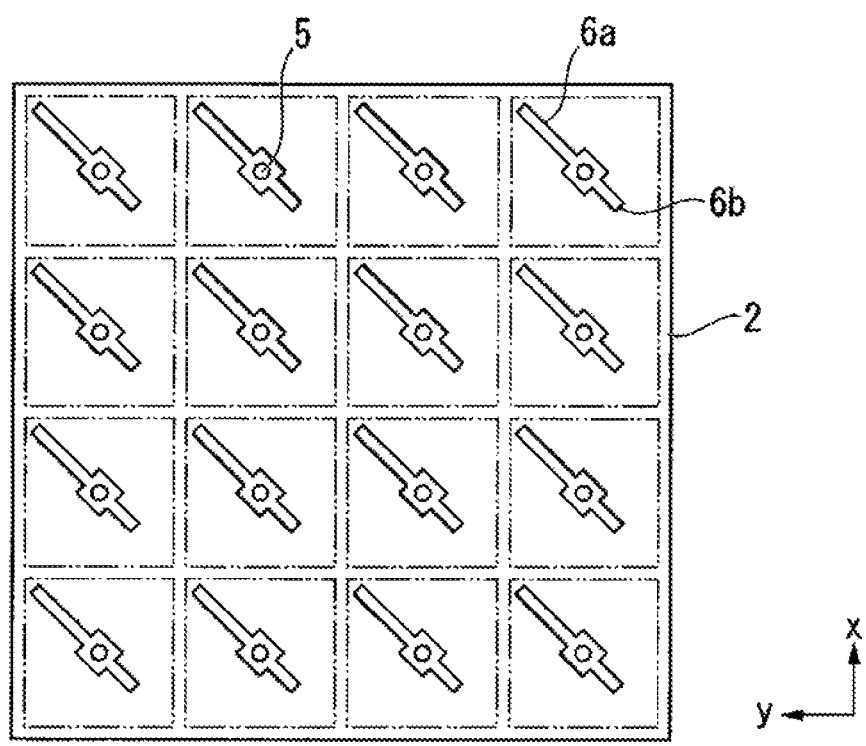
FIG. 9 is a plan view illustrating the structural body according to the modified example of the first embodiment.

In the first embodiment, although the configuration in which one end of the transmission line 6 becomes an open end and the other end thereof is connected to the conductor via 5 is exemplified, the portion to be connected to the conductor via 5 in the transmission line 6 may be other than the end. For example, as shown in FIG. 9, using the connection portion to the conductor via 5 as a branch portion, the transmission line 6 may include branch lines 6a and 6b which are mutually branched from the branch portion. Here, the branch lines 6a and 6b are all continuous with the branch portion, and the lengths thereof are different from each other. In the transmission path having such a configuration, the branch lines 6a and 6b can be seen as branch lines which are branched starting from the connection portion. In addition, in the transmission line constituted by the branch lines 6a and 6b, it can also be seen that the electrical connection is made in the connection portion between the starting point and the ending point. In such a regular structural body, since the impedance transformation periods of the branch lines 6a and 6b are different from each other, the degree of freedom in design of the dispersion relation becomes extremely high. Further, the branch line using a portion of the branch lines 6a and 6b as a basing point may be provided, and the branch lines 6a and 6b may extend in the directions different from each other. The planar shape of the branch line can be appropriately changed to a linear shape, a broken line shape, a curvilinear shape, a combination thereof, and the like.

In the first embodiment, although the configuration in which the conductor patch 4 has a square shape is exemplified, the conductor patch 4 may have a shape other than the square shape. In addition, although the configuration in which the unit structure is periodically arranged in a square lattice shape is exemplified, the adjacent conductor patches 4 may be capacitively coupled to each other, and the array of the unit structure may be a triangular lattice-shaped array or a one-dimensional periodic array. Even when the form different from that of the first embodiment is adopted as the shape or the placement of the conductor patch 4, the effect of the invention can be obtained when the adjacent conductor patches 4 are capacitively coupled to each other.

In the first embodiment, although the case in which the structural body operates as an EBG structure has been described, the structural body can also be brought into operation as a left-handed medium.

In a second to fourth embodiments described next, a printed board, an antenna, and a transmission line waveguide converter will be described including the structural body according to the invention. In the second to fourth embodiments, the structural body mainly operates as an EBG structure.

In addition, in a fifth to eighth embodiments described later, the antenna will be described including the structural body. In the fifth to eighth embodiments, the structural body mainly operates as a left-handed medium.

Second Embodiment

Figure 10:
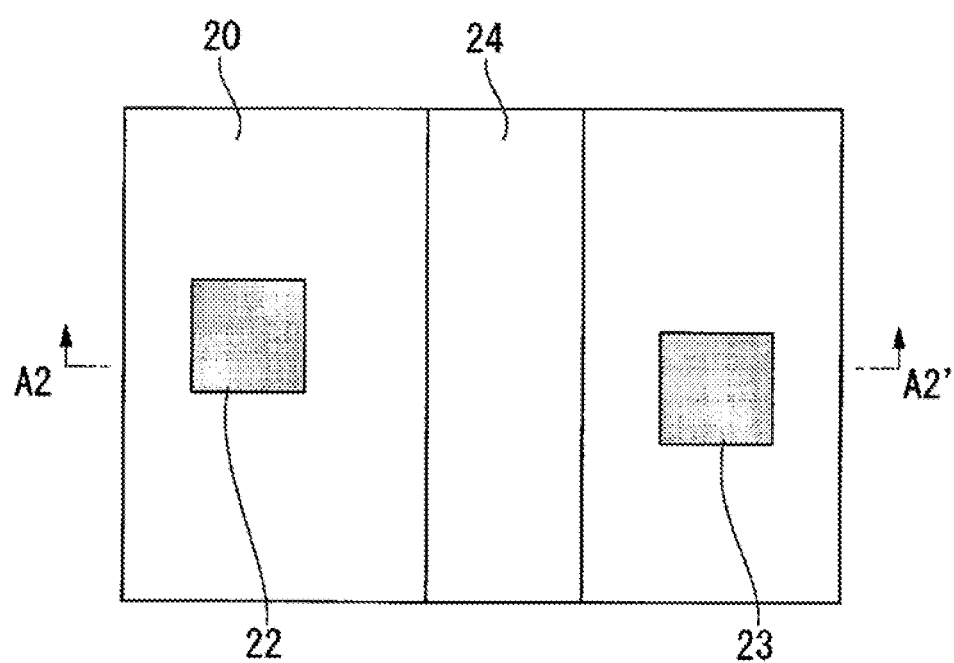
FIG. 10 is a plan view illustrating a printed board according to a second embodiment.
Figure 11:
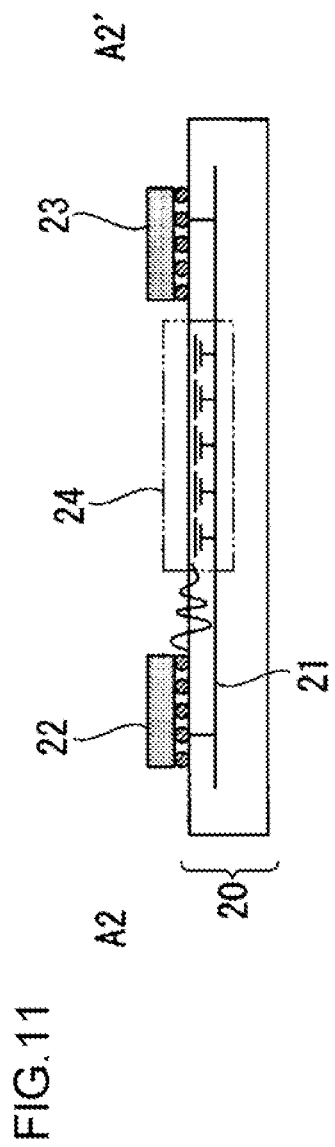
FIG. 11 is a cross-sectional view illustrating the printed board according to the second embodiment.

Next, the printed board according to the second embodiment of the invention will be described. FIG. 10 is a plan view schematically illustrating a configuration of a printed board 20 according to the second embodiment. FIG. 11 is a cross-sectional view taken along the A2-A2' line of FIG. 10. As shown in FIGS. 10 and 11, the printed board 20 includes a ground plane 21, devices 22 and 23, and an EBG structure 24 disposed between the devices 22 and 23. In the printed board 20, the thickness portion from the surface layer on which the devices 22 and 23 are provided to the ground plane 21 is formed by a dielectric. The device 22 is a device serving as a noise source, and the device 23 is a device susceptible to noise.

As shown in FIG. 11, the devices 22 and 23 are all connected to the ground plane 21. In the dielectric portion and the ground plane 21 of the printed board 20, a kind of surface wave line is formed. The noise generated in the device 22 propagates through the surface wave line and is incident on the device 23, thereby resulting in a factor which may causes malfunction and the like in the device 23. In the printed board 20 of the second embodiment, the EBG structure 24 is disposed so that blocking the surface wave line which can serve as the propagation path of the noise between the devices 22 and 23.

Here, the band-like EBG structure 24 is disposed continuously from one end of the printed board 20 to the other end thereof, in the direction intersecting the direction from the device 22 toward the device 23. The EBG structure 24 is constituted by the structural body of the invention, and includes a bandgap in the dispersion relation as described in the first embodiment. The bandgap is set to the frequency band including the frequency band of the noise generated in the device 22.

In the printed board 20 having such a configuration, the noise generated in the device 22 is blocked by the EBG structure 24. Therefore, the arrival of the noise at the device 23 is greatly reduced, and thus the malfunction of the device 23 can be suppressed. Since the EBG structure 24 is a structure to which the invention is applied, it is possible to reduce the thickness of the printed board 20. In addition, since the bandgap of the EBG structure 24 can be shifted to a lower frequency at a low cost, it is possible to correspond to the noise of the wide frequency band, and to form the low-cost printed board 20.

Meanwhile, in the second embodiment, although the configuration in which the band-like EBG structure 24 is provided is exemplified, the EBG structure 24 may be disposed so as to block the propagation path of the noise, and the planar shape or the placement of the EBG structure 24 can be appropriately modified. For example, as shown in FIG. 12, the EBG structure 24 may be provided so as to surround the device 23 susceptible to the noise.

In addition, in the second embodiment, the configuration in which the EBG structure is mounted on the printed board is exemplified. However, even when the EBG structure is mounted on electronic parts other than the printed board, the effect of the invention can be obtained. For example, it is of course possible to provide the EBG structure according to the invention on a device package board and the like, or to provide the EBG structure in a semiconductor device including silicon using a micro interconnect process.

In addition, herein, suppression of noise propagation between the devices is described by way of example. However, for example, even when unnecessary coupling between the antennas installed close to each other is suppressed, the EBG structure according to the invention can be used just like the case of the device.

Third Embodiment

Figure 13B:
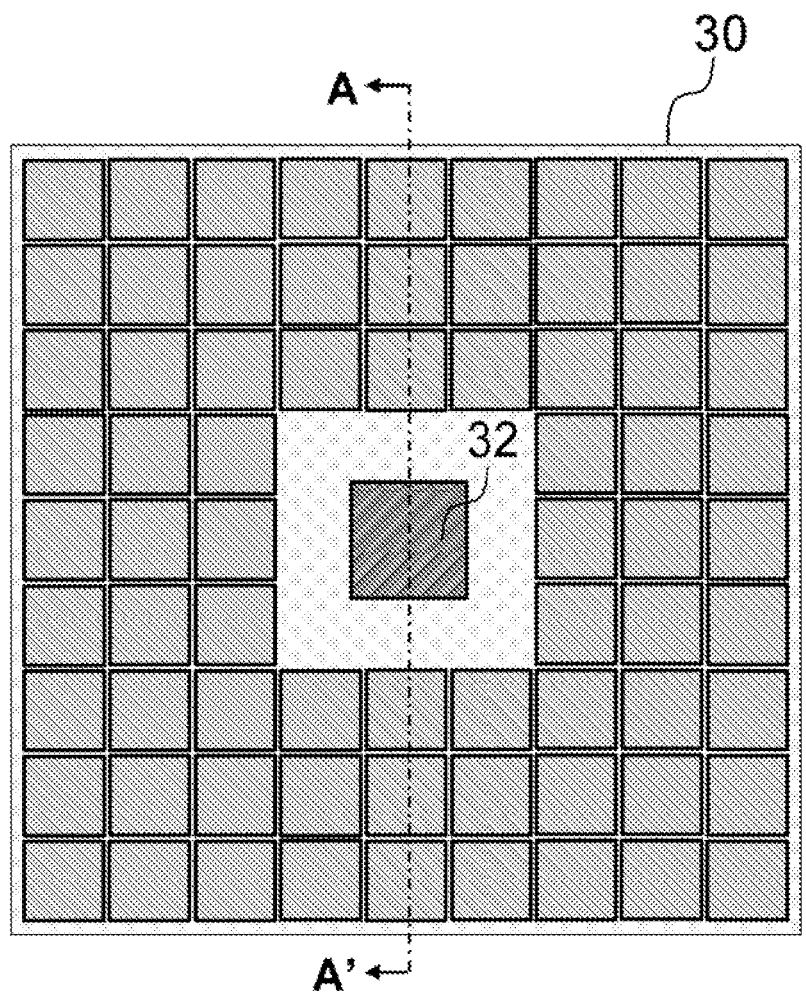
FIG. 13(b) is a plan view illustrating the antenna shown in FIG. 13(a).

Next, the antenna according to a third embodiment of the invention will be described. FIG. 13(a) is a cross-sectional view illustrating an example of a patch antenna in which the EBG structure according to the invention is used as a reflective plate, and FIG. 13(b) is a plan view illustrating the patch antenna. As shown in FIG. 13, the patch antenna 30 includes an EBG structure 31, an antenna element 32, and a coaxial power feed line 33.

The patch antenna 30 is mainly constituted by a roughly plate-like board. The antenna element 32 has a roughly plate-like shape, and is provided in contact with one surface of the board. The coaxial power feed line 33 is provided on the other surface of the board, and is electrically connected to the antenna element 32 through the board. The EBG structure 31 is disposed in the periphery annularly surrounding the antenna element 32, or in a portion of this periphery. The bandgap of the EBG structure 31 is designed in response to the use frequency band of the patch antenna 30.

In the patch antenna 30 having such a configuration, the surface wave generated in the antenna element 32 propagates through one surface of the board and is blocked by the EBG structure 31. Therefore, since the surface wave is prevented from propagating to the other surface of the board and the surface wave is not emitted from the other surface, it is possible to avoid deterioration of the antenna characteristics.

Figure 14A:
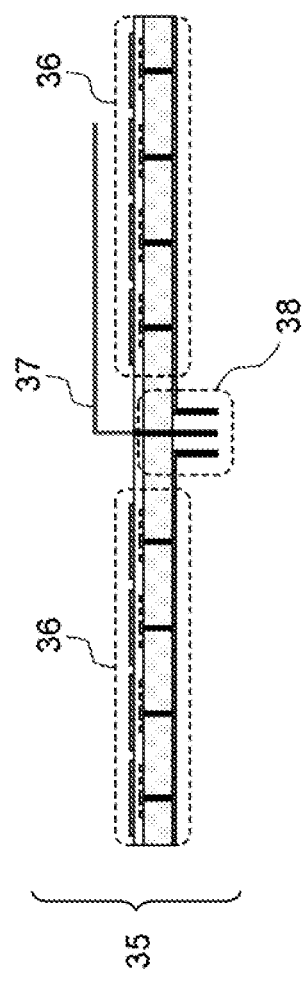
FIG. 14(a) is a cross-sectional view illustrating the antenna according to a modified example of the third embodiment.
Figure 14B:
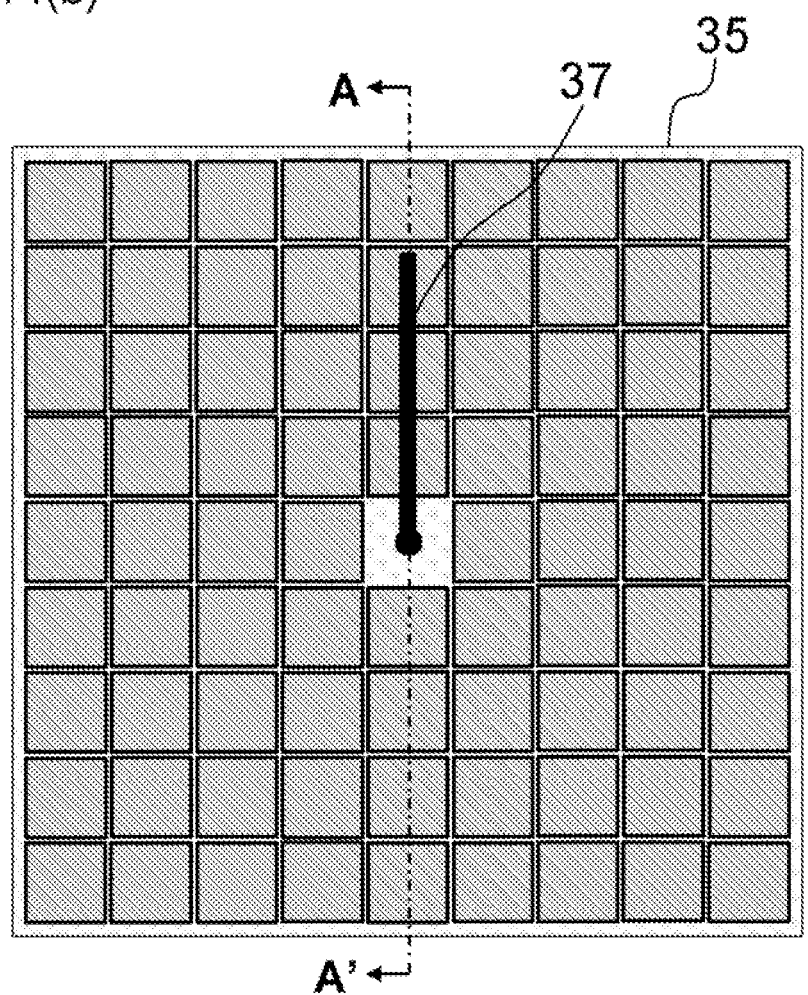
FIG. 14(b) is a plan view illustrating the antenna shown in FIG. 14(a).

Meanwhile, it is also possible to apply the structural body of the invention to another antenna of the patch antenna, for example, a reverse L-shaped antenna and the like. FIG. 14(a) is a cross-sectional view illustrating an example of a reverse L-shaped antenna 35 in which the EBG structure according to the invention is used as a reflective plate, and FIG. 14(b) is a plan view illustrating the patch antenna.

As shown in FIG. 14, the reverse L-shaped antenna 35 includes an EBG structure 36, an antenna element 37, and a coaxial power feed line 38. The reverse L-shaped antenna 35 is mainly constituted by a roughly plate-like board. The antenna element 37 protrudes from one surface of the board in a direction normal to this surface, and extends in the direction of the board, and bends at a position away from the board. The coaxial power feed line 38 is provided on the other surface of the board, and is electrically connected to the antenna element 37 through the board.

The EBG structure 36 is disposed in the periphery annularly surrounding the antenna element 37 of the portion protruding from one surface in the normal direction, or in a portion of this periphery. The EBG structure 36 is disposed from a region which overlaps the antenna element 37 extending in the plane direction of the board and the outside of this region. The EBG structure 36 is configured to function as a reflective plate of the antenna element 37.

In the reverse L-shaped antenna 35 having such a configuration, the emission from the other surface is suppressed similarly to the patch antenna 30. In addition, since the EBG structure 36 functions as a reflective plate and electromagnetic waves are reflected in phase by the EBG structure 36, the antenna element 37 can be disposed close to the surface of the EBG structure 36. Thereby, it is possible to realize the reverse L-shaped antenna 35 considerably thinner than that in the related art. Meanwhile, here, although the patch antenna 30 and the reverse L-shaped antenna 35 are exemplified as an antenna, it is also possible to apply the structural body of the invention to another form of antenna, whereby the effect of the invention can be obtained.

Fourth Embodiment

Figure 15:
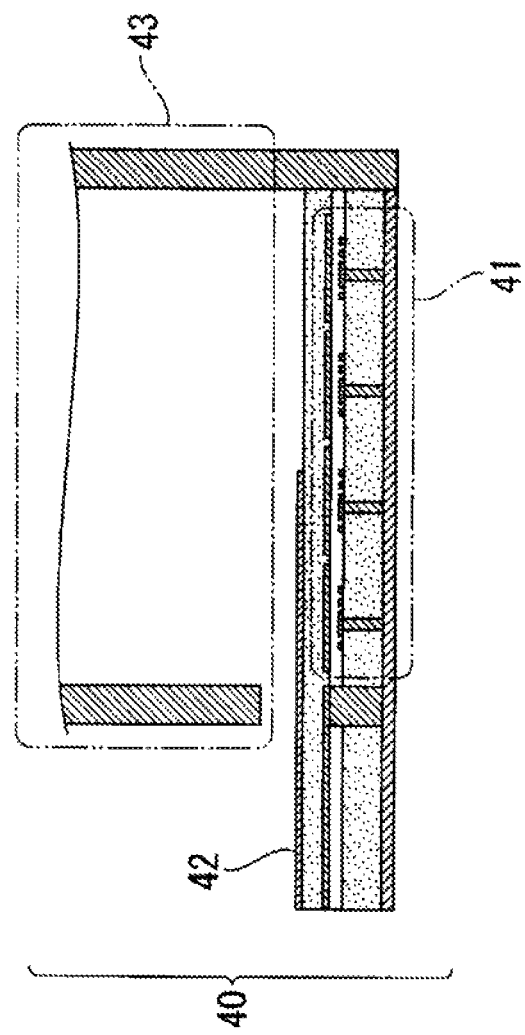
FIG. 15 is a cross-sectional view illustrating a transmission line waveguide converter according to a fourth embodiment.

Next, the transmission line waveguide converter according to the fourth embodiment of the invention will be described. FIG. 15 is a cross-sectional view illustrating an example of the transmission line waveguide converter in which the EBG structure according to the invention is used as a reflective plate. As shown in FIG. 14, a transmission line waveguide converter 40 includes an EBG structure 41 used as a reflective plate, a transmission line 42, and a waveguide 43. The bandgap of the EBG structure 41 is designed in response to the frequency band of transmitted electromagnetic waves.

In the transmission line waveguide converter 40 having such a configuration, since electromagnetic waves are reflected in phase by the EBG structure 41, the transmission line 42 can be disposed close to the surface of the EBG structure 41. Thereby, it is possible to realize the thin transmission line waveguide converter 40.

Fifth Embodiment

Next, the antenna according to a fifth embodiment of the invention will be described. The antenna according to the embodiment includes the structural body of the invention, and is configured so that the structural body operates as a left-handed medium.

Figure 16:
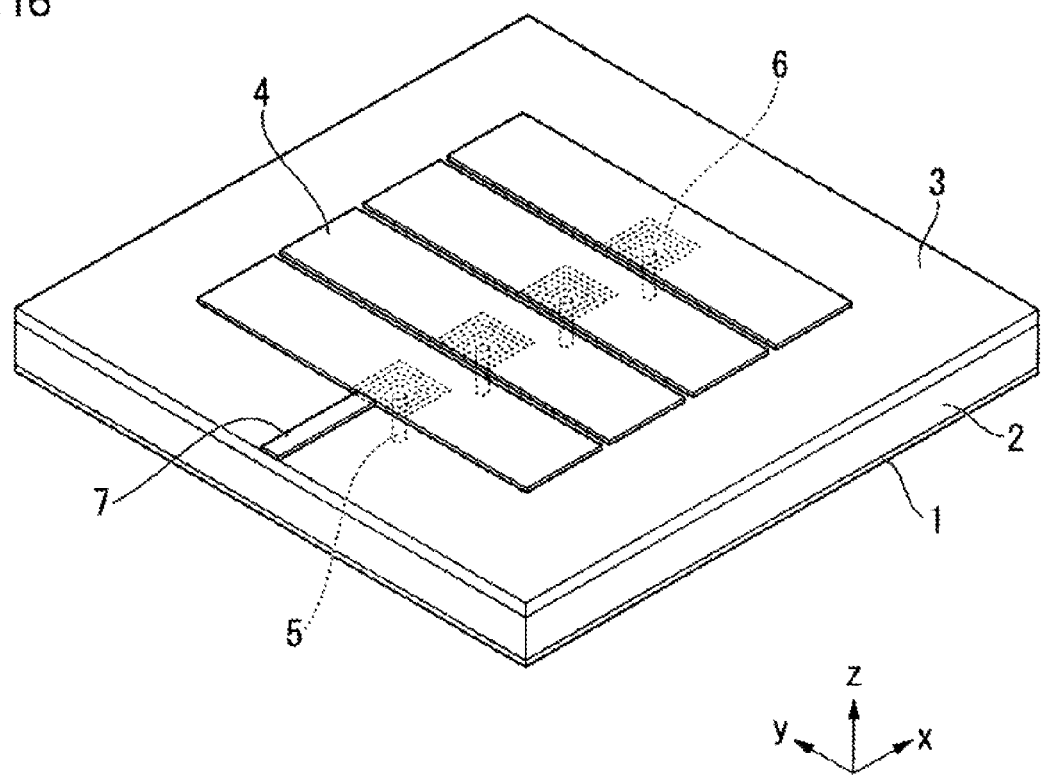
FIG. 16 is a perspective view illustrating the antenna according to a fifth embodiment.
Figure 17:
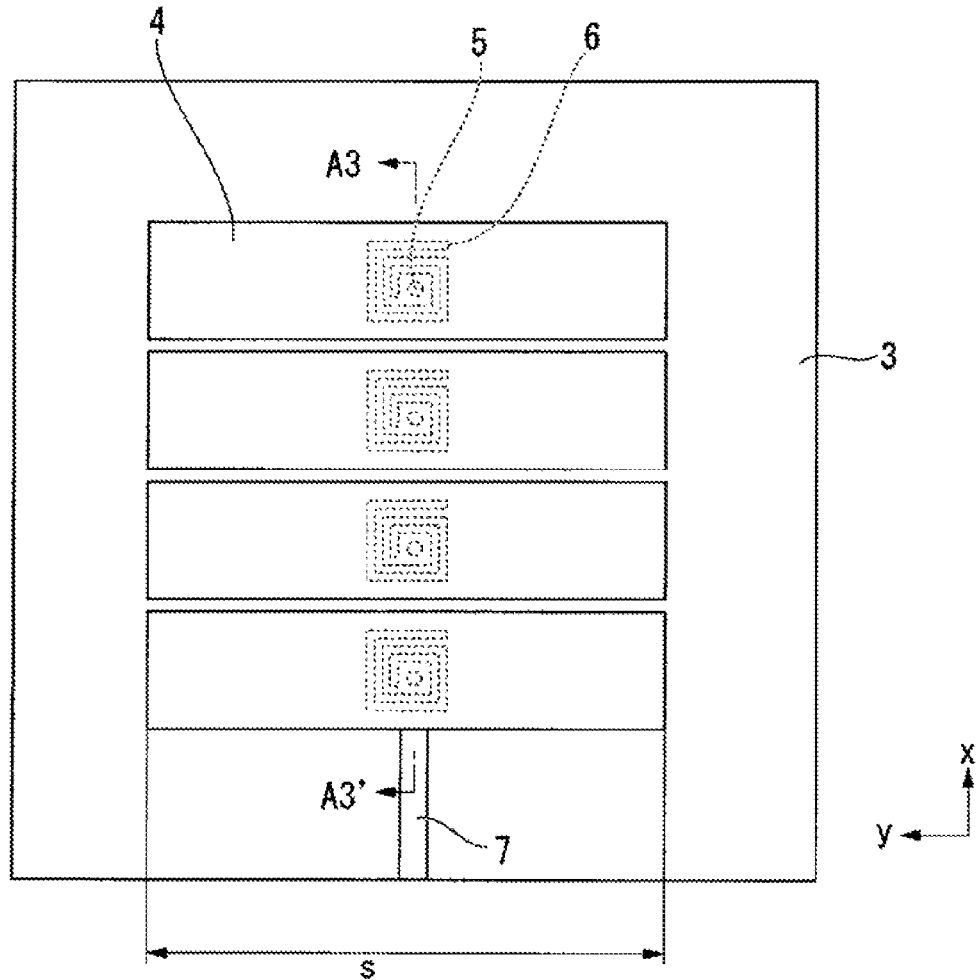
FIG. 17 is a plan view illustrating the antenna according to the fifth embodiment.
Figure 18:
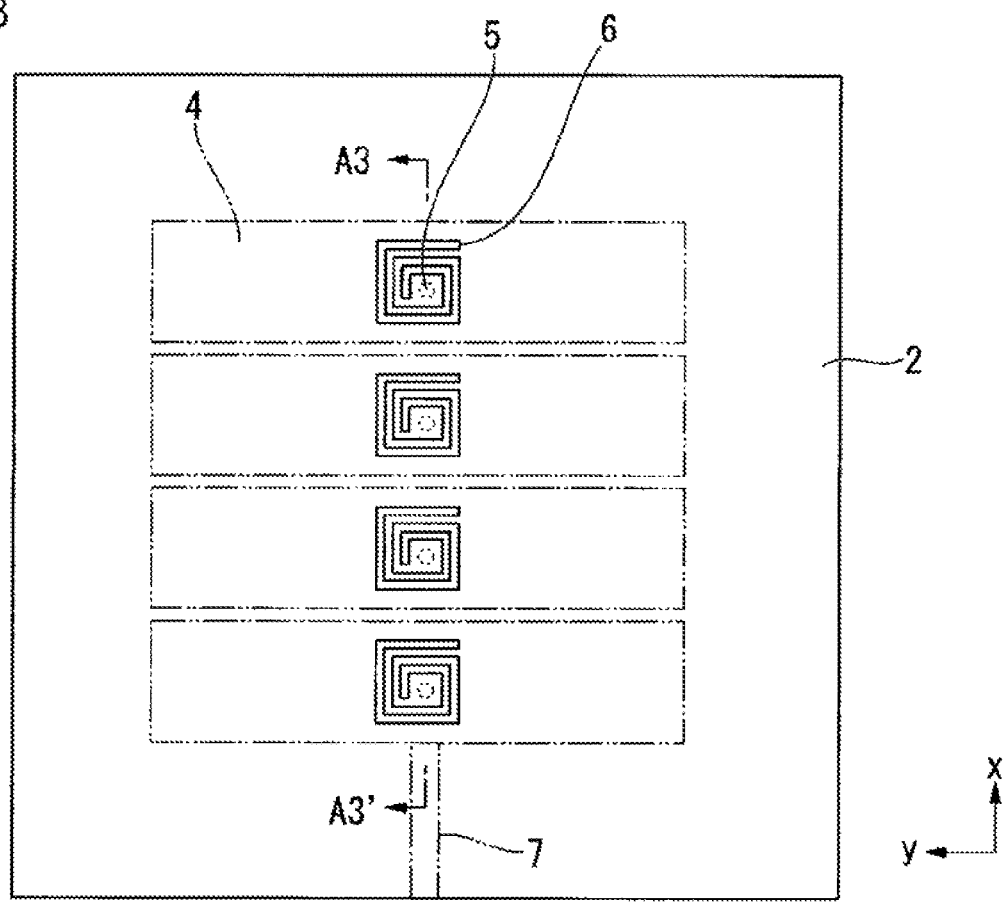
FIG. 18 is a plan view illustrating the antenna according to the fifth embodiment.
Figure 19:
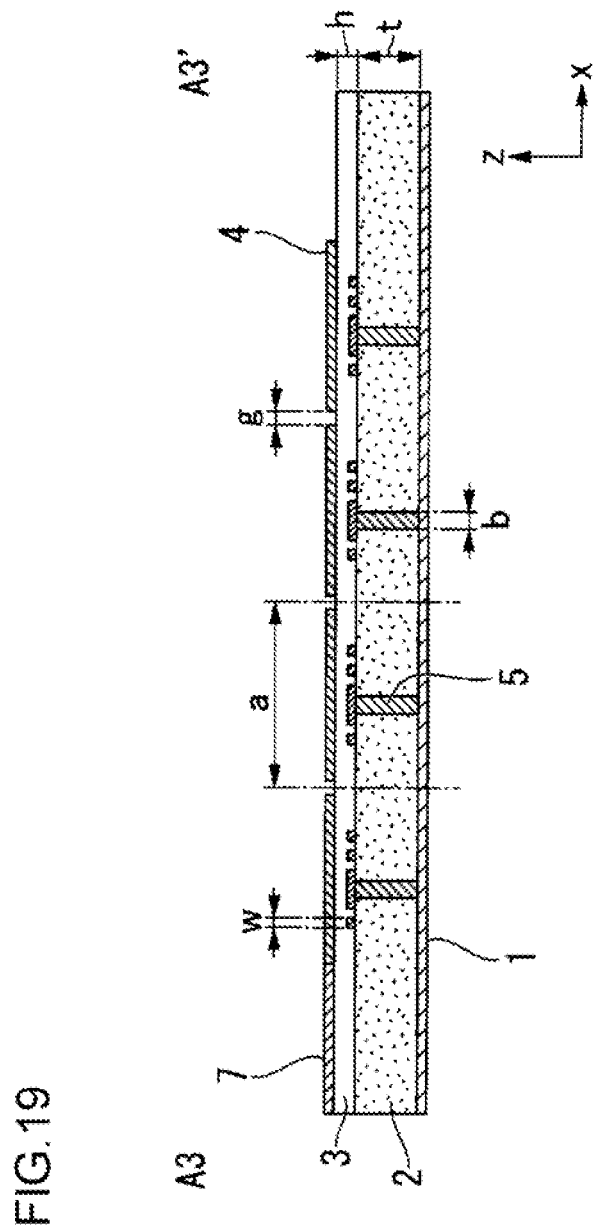
FIG. 19 is a cross-sectional view illustrating the antenna according to the fifth embodiment.

FIG. 16 is a perspective view schematically illustrating a configuration of the antenna according to fifth embodiment of the invention. FIG. 16 shows an internal structure when seen through a portion of the antenna, for convenience of the description. FIG. 17 is a plan view when the antenna of the fifth embodiment is seen from the z-axis forward direction. FIG. 18 is a plan view when the antenna of the fifth embodiment is seen from the z-axis forward direction by seeing through the conductor patch 4. FIG. 19 is a cross-sectional view taken along the A3-A3' line of FIGS. 17 and 18.

As shown in FIG. 19, the antenna of the fifth embodiment includes the conductor plane 1 which is the first conductor plane, the lower dielectric 2, the upper dielectric 3, the conductor patch 4 which is a second conductive plane, the conductor via 5, the transmission line 6, and a microstrip line 7 which is a power feeding portion. The conductor plane 1 and the conductor patch 4 are all plate-like in shape. The structural body in the fifth embodiment includes the conductor plane 1 as a lowermost layer, and has a structure in which the lower dielectric 2, the transmission line 6, the upper dielectric 3, and the conductor patch 4 are laminated in this order from the conductor plane 1 toward the upper layer. The microstrip line 7 is provided on the same plane as the plane having the conductor patch 4 provided thereon, that is, on the upper dielectric 3, and is electrically connected to one conductor patch 4. The conductor via 5 passes through the lower dielectric 2. The transmission line 6 is electrically connected to the conductor plane 1 through the conductor via 5.

As shown in FIGS. 17 and 18, the antenna of the fifth embodiment has a structure in which the unit structure is periodically disposed one-dimensionally on the conductor plane 1. The unit structure is a portion including the conductor patch 4. The unit structure includes the conductor via 5 and the transmission line 6 which are disposed in the portion interposed between one conductor patch 4 and the conductor plane 1. Meanwhile, sign shown in FIG. 17 denotes the dimensions of the side (here, the long side) facing the adjacent conductor patch 4 in the conductor patch 4. In addition, sign a in FIG. 19 denotes the width of a region including one unit structure, sign b denotes the diameter of the conductor via 5, sign g denotes the interval of the conductor patch 4, sign h denotes the thickness of the upper dielectric 3, sign w denotes the width of the transmission line 6, and sign t denotes the thickness of the lower dielectric 2, respectively.

The conductor patch 4 of the embodiment is roughly rectangular in planar shape. The dimensions in the x-axis direction and the dimensions in the y-axis direction of the conductor patch 4 are smaller than those of the conductor plane 1. The plane direction of the conductor patch 4 is roughly parallel to the plane direction of the conductor plane 1. A plurality of conductor patches 4 is periodically disposed on the plane surface facing the conductor plane 1. Here, a plurality of conductor patches 4 is periodically disposed at regular intervals in the x-axis direction which is a short-side direction of the conductor patch 4, and is arranged one-dimensionally. The electrical capacitance corresponding to the interval g is formed between two conductor patches 4 which are adjacent to each other in a plurality of conductor patches 4.

The microstrip line 7 is electrically connected to the conductor patch 4 located at the endmost portion of a plurality of conductor patches 4. The microstrip line 7 extends in the x-axis negative direction from the conductor patch 4, and is electrically connected to a wireless circuit which is not shown in the drawing. The electrical signal supplied from the wireless circuit is input to the conductor patch 4 through the microstrip line 7.

The transmission line 6 that uses the conductor patch 4 as a return path is disposed between each of a plurality of conductor patches 4 and the conductor plane 1. The upper dielectric 3 is disposed between the transmission line 6 and the conductor patch 4. The planar shape of the transmission line 6 of the embodiment is a spiral shape. One end of the transmission line 6 is disposed in the central portion of the spiral shape, and electrically conducts with the conductor via 5 in contact therewith. The other end of the transmission line 6 is disposed in the circumferential portion of the spiral shape, and becomes an open end. That is, in the structural body of the fifth embodiment, the first conductor plane (conductor plane 1) is selected as any one conductor plane of the first conductor plane (conductor plane 1) and the second conductor plane (conductor patch 2). In this manner, the transmission line 6 is configured to function as an open stub that uses the conductor patch 4 which is the other conductor plane as a return path.

Next, the characteristics and the basic principle of operation of the antenna according to the fifth embodiment will be described. In the antenna according to the fifth embodiment, a plurality of unit structures which are periodically arranged is capacitively coupled to each other, and operates as the one-dimensional CRLH transmission line. When at least one of the unit structures is electrically excited, line-length resonance is generated in the CRLH transmission line and thus electromagnetic waves are emitted. Here, the unit structure connected to the microstrip line 7 is configured to be electrically excited by the electrical signal transmitted through the microstrip line 7. Meanwhile, here, although the configuration in which power is fed to the end of the CRLH transmission line is exemplified, power may be fed to the conductor patch other than the end of the CRLH transmission line, in order to obtain impedance matching between the antenna and the power feeding portion.

The antenna of the fifth embodiment is configured to use generation of half-wavelength resonance in the x-axis direction of the CRLH transmission line, and can be considered as one type of resonator. The relationship between the wavelength and the frequency in the resonator is determined by the dispersion relation of a medium inside the resonator. In a normal dielectric, the dispersion relation of the relative dielectric constant ε and the relative magnetic permeability μ is given by the following Expression (4).

[Expression 4]

$$\omega = \frac{c_0}{\sqrt{\varepsilon\mu}} k \quad (4)$$

In Expression (4), $c_0$ denotes the speed of light in vacuum, $\omega(=2\pi f)$ denotes the angular frequency, and $k(=2\pi/\lambda)$ denotes the wave number. From Expression (4), it is known that the normal dielectric acts as a right-handed medium of which the wavelength becomes larger when the angular frequency is decreased. The antenna of the embodiment operates as the CRLH transmission line by periodically arranging the unit structure. In the frequency band of electromagnetic waves emitted from the antenna, the dispersion relation is set so that the CRLH transmission line operates as a left-handed medium. Since the CRLH transmission line operates as a left-handed medium, it is possible to make the wavelength of the electromagnetic wave shorter as the frequency becomes lower, and to realize considerable miniaturization of the antenna.

It is necessary that the admittance Y of FIG. 4 is inductive (the imaginary part of the admittance Y is negative) in a desired frequency band in order for the CRLH transmission line to operate as a left-handed medium. Therefore, in order to shift the operating band of the antenna to a lower frequency, it is preferable to shift the frequency band in which the admittance Y becomes inductive to a lower frequency. From Expression (2) and Expression (3), the admittance Y is a function of the line length d of the open stub, and the frequency band in which the admittance Y becomes inductive can be shifted to a lower frequency by increasing the line length d. It is possible to calculate the dispersion relation of the CRLH transmission line in the antenna by applying the periodic boundary conditions to the equivalent circuit of the unit structure shown in FIG. 4.

Figure 20:
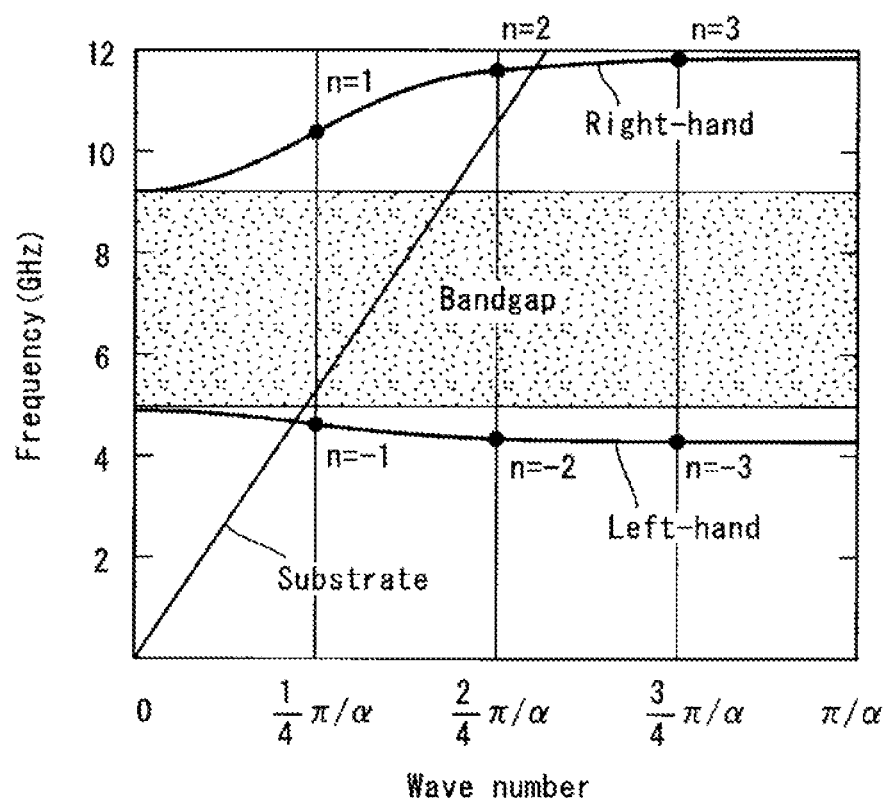
FIG. 20 is a diagram illustrating the dispersion relation of the CRLH transmission line in the antenna according to the fifth embodiment.

FIG. 20 is a graph illustrating an example of the dispersion relation. Data used in the graph of FIG. 20 are various types of parameters shown in FIGS. 17 and 19, where the values thereof are set to s=12 mm, a=3.5 mm, g=50 μm, t=800 μm, h=100 μm, w=150 μm, and b=250 μm, and the line length d is set to 8 mm, the relative dielectric constants ε of the lower dielectric 2 and the upper dielectric 3 are set to 4.188, and the relative magnetic permeability μ is set to 1. In the graph of FIG. 20, the horizontal axis denotes the wave number, and the vertical axis denotes the frequency.

As shown in FIG. 20, the dispersion relation of the CRLH transmission line in the fifth embodiment is expressed by a curve falling to the right in the frequency band from 4.2 to 4.9 GHz. Therefore, the CRLH transmission line operates as a left-handed medium in this frequency band. In addition, the dispersion relation is expressed by a curve rising to the right in the frequency band from 9.3 GHz to 11.7 GHz. Therefore, the CRLH transmission line operates as a right-handed medium in this frequency band. In general, the conditions in which half-wavelength resonance is generated in a resonator having a line length of L are given by the following Expression (5), where n is an integer.

[Expression 5]

$$k = \frac{n\pi}{L} \quad (5)$$

When the number of unit structures constituting the CRLH transmission line is set to N, the line length L of the entire CRLH transmission line is given by L=N×a. When the line length L is substituted into Expression (5), the following Expression (6) is obtained as the resonance conditions in the CRLH transmission line.

[Expression 6]

$$k = \frac{n}{N}\frac{\pi}{a}, n = -(N-1), \ldots -1, 0, 1 \ldots, (N-1) \quad (6)$$

The vertical line in the graph of FIG. 20 denotes the wave number that satisfies the resonance conditions when N=4 and a=3.5 mm are set corresponding to the antenna structure of FIG. 16. Therefore, the intersection of the vertical line of FIG. 20 with the dispersion relation provides a half-wavelength resonance frequency. In the frequency band of FIG. 20, resonance points equivalent to n=0, 1, 2, and 3 are present in the right-handed band, and resonance points equivalent to n=0, −1, −2, and −3 are present in the left-handed band.

In the graph of FIG. 20, the straight line which passes through the origin is a dispersion relation of a dielectric substrate constituted by the lower dielectric 2 and the upper dielectric 3. The dispersion relation of the dielectric substrate is obtained by substituting the relative dielectric constants of the lower dielectric 2 and the upper dielectric 3 of $\in$=4.188 and the relative magnetic permeability of $\mu$=1 into Expression (5). In the frequency band lower than that of the dispersion relation of the dielectric substrate, the wavelength of electromagnetic waves propagating through the CRLH transmission line becomes shorter than that in the inside of the dielectric substrate. Therefore, in the CRLH transmission line of the embodiment, the resonance points equivalent to n=0, −1, −2, and −3 of the left-handed band are used, whereby it is possible to realize the antenna smaller than the normal patch antenna in which the dielectric substrate is used.

In addition, in the resonance points included in the frequency band higher than that of the dispersion relation of the dielectric substrate, the wavelength of electromagnetic waves propagating through the CRLH transmission line becomes longer than that in the inside of the dielectric substrate. Therefore, it is also possible to enhance the radiation efficiency, for example, by increasing the size of the antenna.

The admittance Y of the CRLH transmission line in the antenna of the embodiment is calculated by Expression (2) and Expression (3). Therefore, it is possible to design the left-handed band to a desired frequency band by appropriately designing the parameters included in Expression (2) and Expression (3).

In the structural body of the invention, since the degree of freedom in design of the line length d of the open stub is high, it is possible to easily control the operating band of the antenna according to the embodiment, and to reduce the thickness of the antenna. In addition, since the open stub is adopted, it is possible to reduce the number of conductor vias per unit structure, and to form the low-cost antenna.

In addition, it is possible to control the admittance Y by the open stub, and thus there is a decreased need to control the admittance Y by providing the coplanar line. Therefore, there is a decreased need to provide the slit for forming the coplanar line, and thus the emission of unnecessary electromagnetic waves to the outside of the conductor plane 1 through the slit is greatly reduced.

Figure 21:
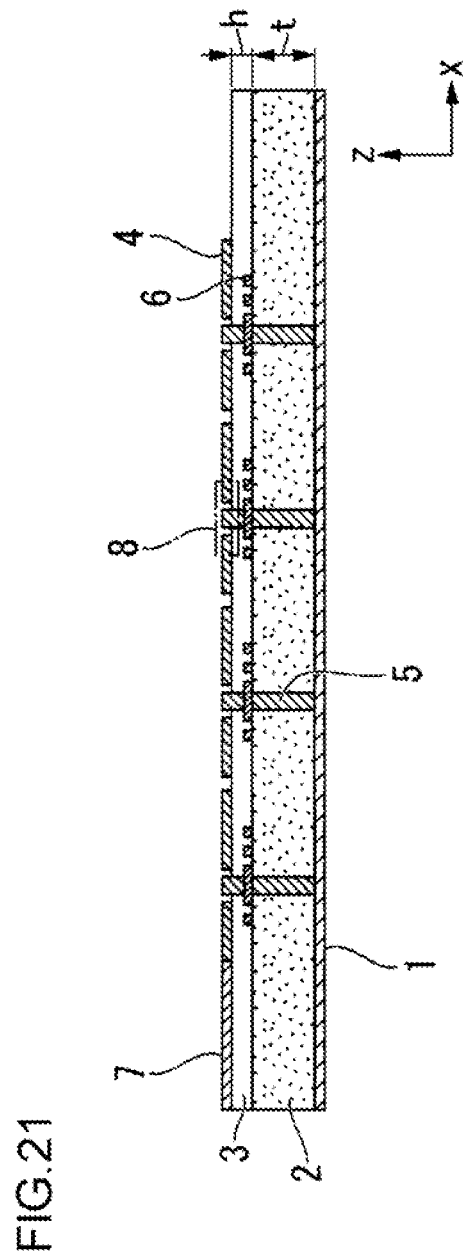
FIG. 21 is a cross-sectional view illustrating the antenna according to a modified example of the fifth embodiment.

Meanwhile, in the fifth embodiment, although the configuration in which the conductor via 5 does not pass through the upper dielectric 3 is exemplified, the conductor via 5 is preferably provided so that the conductor plane 1 is electrically connected to the transmission line 6, and the form of the conductor via 5 can be appropriately modified. For example, as shown in FIG. 21, the configuration in which the conductor via 5 passes through the upper dielectric 3 may be adopted. It is possible to obtain the effect of the invention even in such a configuration. When the conductor via 5 is a through via passing through the upper dielectric 3, in order to electrically insulate the conductor via 5 and the conductor patch 4 from each other, it is preferable to form an opening in the periphery of the conductor via 5 in the conductor patch 4, and to provide the clearance 8.

Figure 22:
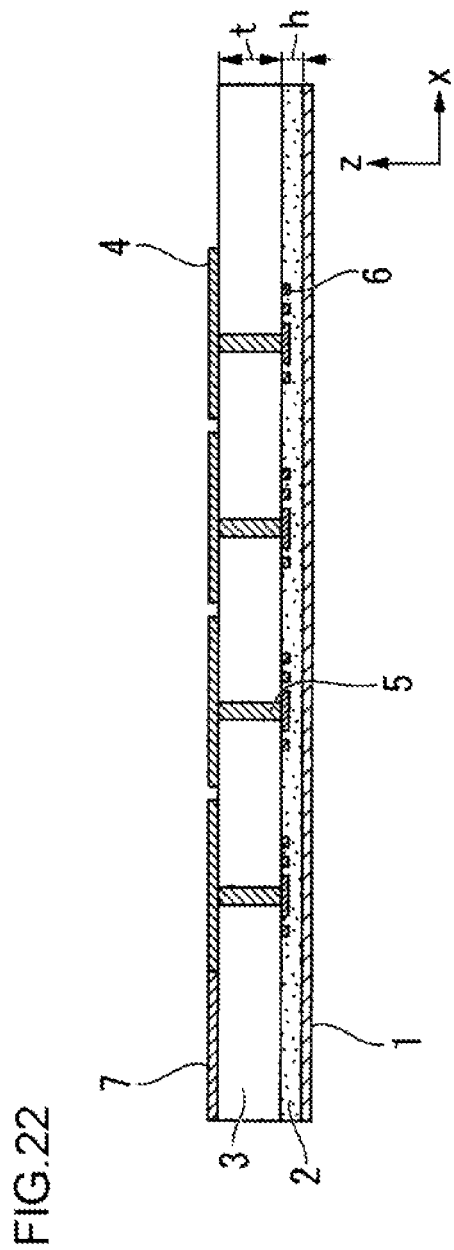
FIG. 22 is a cross-sectional view illustrating the antenna according to the modified example of the fifth embodiment.

In the fifth embodiment, although the configuration in which the transmission line 6 is connected to the conductor plane 1 through the conductor via 5 is exemplified, the transmission line 6 may be connected to the conductor patch 4 through the conductor via 5 as shown in FIG. 22. In such a configuration, the conductor patch 4 is selected as any one conductor plane of the first conductor plane (conductor plane 1) and the second conductor plane (conductor patch 4). The transmission line 6 functions as an open stub that uses the conductor plane 1 which is the other conductor plane as a return path, and the antenna having such a configuration also operates in the same manner as that of the fifth embodiment.

Figure 23:
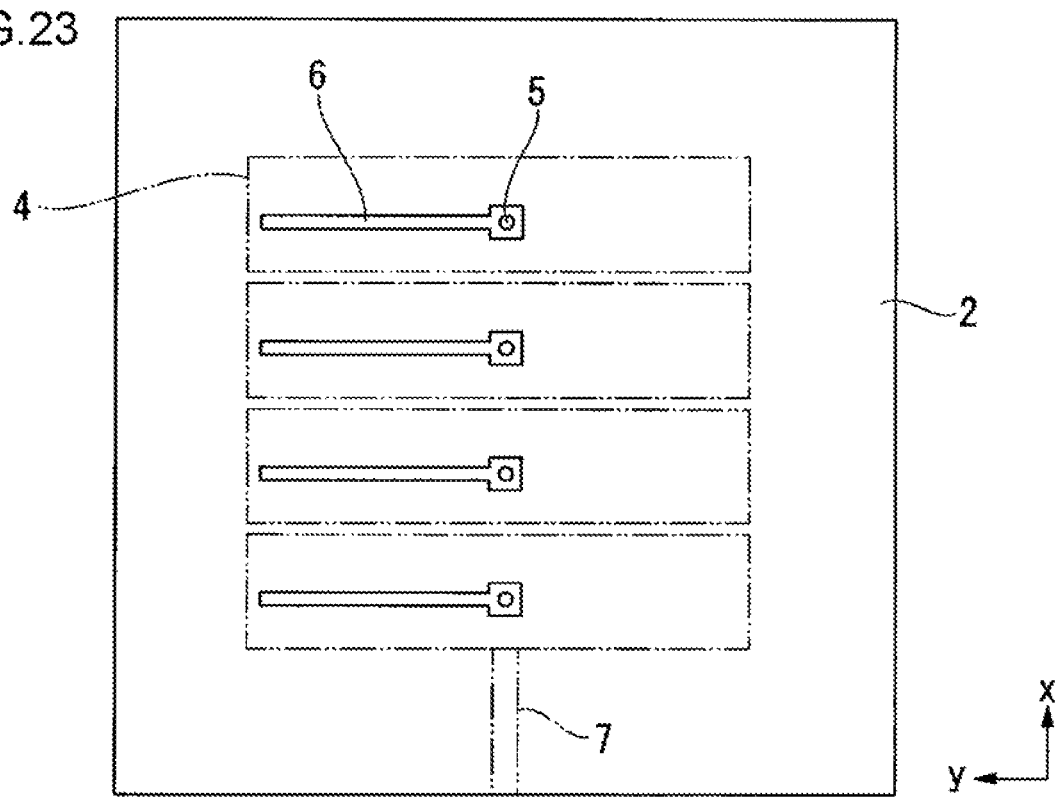
FIG. 23 is a plan view illustrating the antenna according to the modified example of the fifth embodiment.

In the fifth embodiment, although the configuration in which the transmission line 6 is formed in a spiral shape is exemplified, the configuration in which the transmission line is formed in a substantially linear shape may be applied, for example, as shown in FIG. 23. In the transmission line 6 shown in FIG. 23, one end thereof two-dimensionally overlaps the substantially central portion of the conductor patch 4, and the other end thereof two-dimensionally overlaps one of the ends of the conductor patch 4 in the long side direction. The transmission line 6 is electrically connected to the conductor via 5 in one end thereof. The shape of the transmission line 6 may be a meandering shape and the like in addition to a spiral shape or a linear shape. In addition, the placements or the shapes of the transmission line 6 may be different from each other in a plurality of unit structures. For example, the unit structure in which the spiral-shaped transmission line is disposed and the unit structure in which the linear-shaped transmission line is disposed may be mixed.

Figure 24:
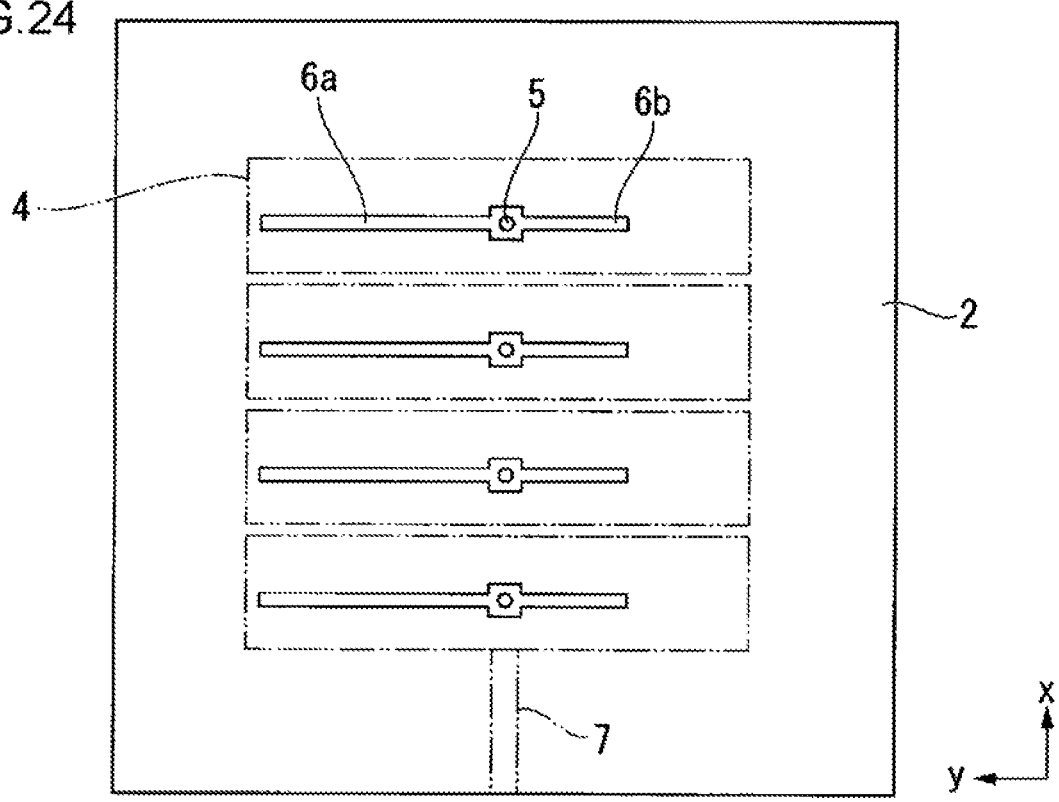
FIG. 24 is a plan view illustrating the antenna according to the modified example of the fifth embodiment.

In the fifth embodiment, although the configuration in which one end of the transmission line 6 becomes an open end and the other end thereof is connected to the conductor via 5 is exemplified, the portion to be connected to the conductor via 5 in the transmission line 6 may be other than the end. For example, as shown in FIG. 24, using the connection portion to the conductor via 5 as a branch portion, the transmission line 6 may include the branch lines 6a and 6b which are mutually branched from the branch portion. Here, the branch lines 6a and 6b are all continuous with the branch portion, and the lengths thereof are different from each other. In the transmission path having such a configuration, the branch lines 6a and 6b can be seen as branch lines which are branched starting from the connection portion. In addition, in the transmission line constituted by the branch lines 6a and 6b, it can also be seen that the electrical connection is made in the connection portion between the starting point and the ending point. In such a structural body, since the impedance transformation periods of the branch lines 6a and 6b are different from each other, the degree of freedom in design of the dispersion relation becomes considerably high. Further, the branch line using a portion of the branch lines 6a and 6b as a basing point may be provided, and the branch lines 6a and 6b may extend in the directions different from each other. The planar shape of the branch line can be appropriately changed to a linear shape, a broken line shape, a curvilinear shape, a combination thereof, and the like.

In the fifth embodiment, although the configuration in which the conductor patch 4 is rectangular is exemplified, the adjacent conductor patches 4 may be capacitively coupled to each other, and the effect of the invention can be obtained even when the conductor patch 4 is formed in a square shape and the like.

Figure 25:
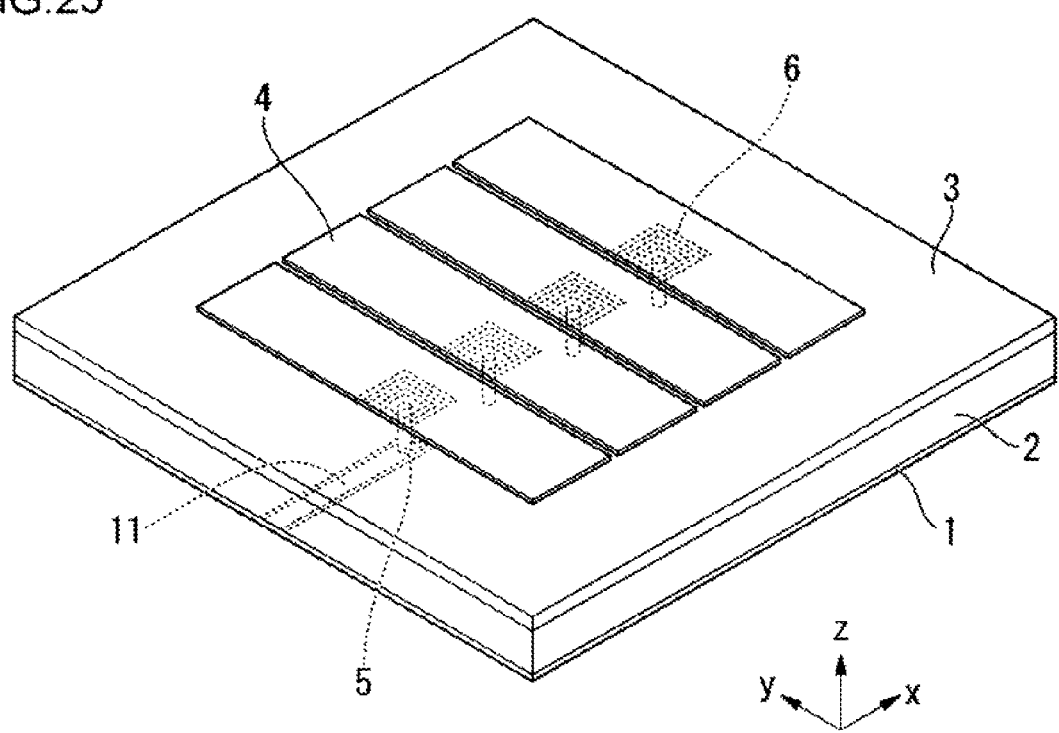
FIG. 25 is a perspective view illustrating the antenna according to the modified example of the fifth embodiment.

In the fifth embodiment, although the case in which the microstrip line is used as the power feeding portion is exemplified, it is also possible to use the power feeding portion other than the microstrip line. For example, as shown in FIG. 25, the configuration may be adopted in which a slit is provided in the conductor plane 1 to form the coplanar line 11, and power is fed to the CRLH transmission line using the coplanar line 11 as the power feeding portion.

The coplanar line 11 is connected to the conductor via 5 of the unit structure located at the end of the CRLH transmission line. The electrical signal from a wireless circuit which is not shown in the drawing is supplied to the CRLH transmission line through the coplanar line 11. In the antenna having such a configuration, since it is necessary to provide a slit in the conductor plane 1, electromagnetic waves leak out from the backside on which the coplanar line 11 is provided in the antenna to the outside thereof. However, it is preferable to provide the coplanar line 11 in at least one unit structure, and the number of coplanar lines 11 can be reduced, thereby allowing the emission of electromagnetic waves to the backside to be minimized. Although the configuration in which power is fed to the end of the CRLH transmission line is illustrated in FIG. 25, power may be fed to the portion other than the end of the CRLH transmission line, in order to obtain impedance matching between the antenna and the power feeding portion. In addition, when the conductor patch 4 is the other conductor plane, it is also possible to provide the coplanar line in the conductor patch 4. For example, when the coplanar line extending in the long side direction of the conductor patch 4 is provided, the inductance included in the admittance Y is easily increased.

Figure 33:
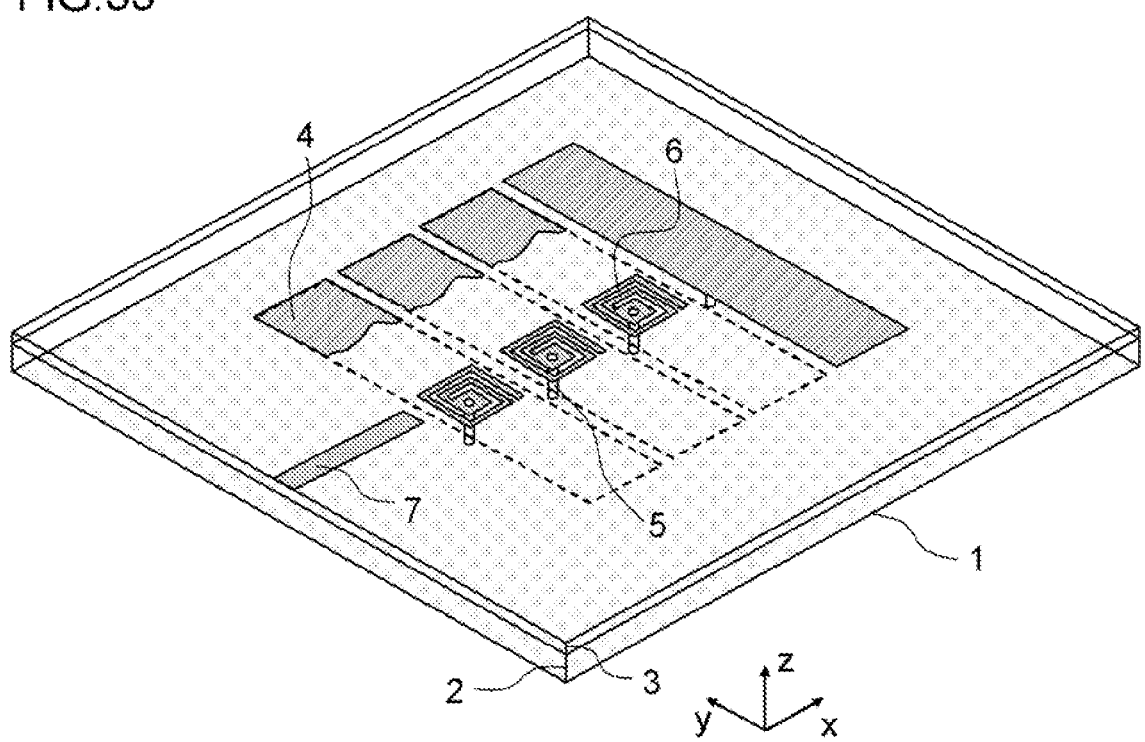
FIG. 33 is a perspective view illustrating the antenna according to the modified example of the fifth embodiment.

In addition, as shown in FIG. 33, the microstrip line 7 used as the power feeding portion in the embodiment is capacitively coupled to the conductor patch 4 of the unit structure located at the outside, whereby power may be fed to the antenna.

Figure 34:
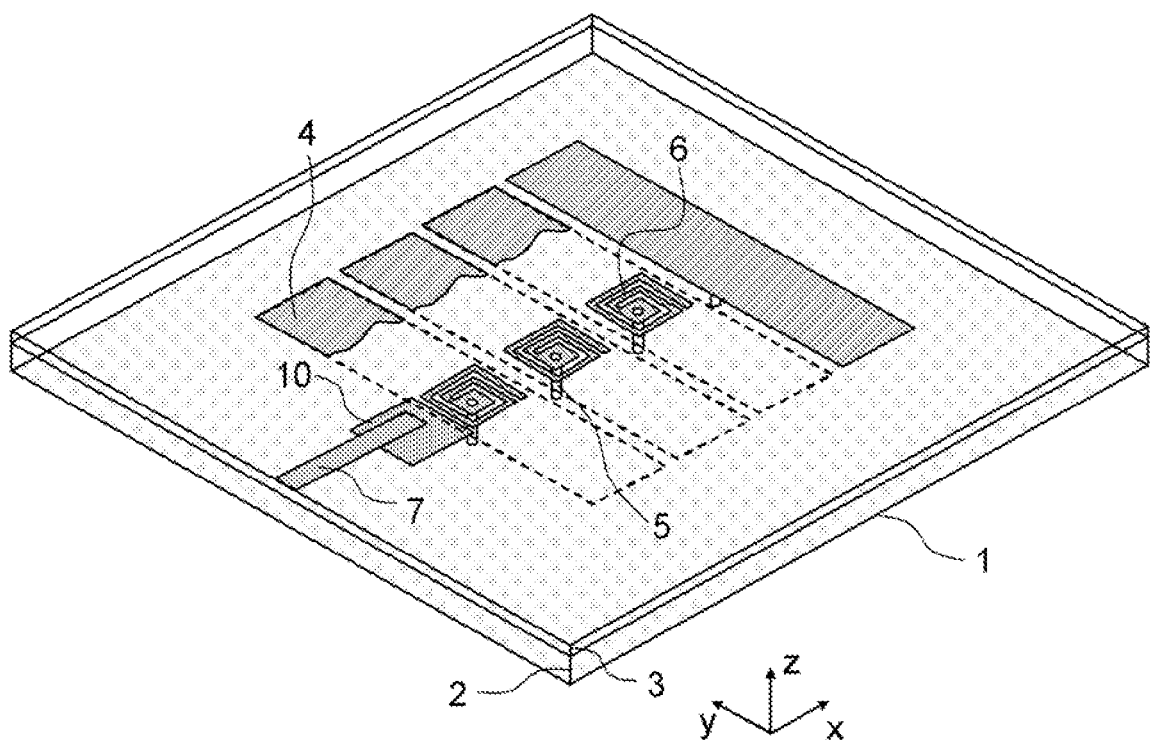
FIG. 34 is a perspective view illustrating the antenna according to the modified example of the fifth embodiment.

In this case, as shown in FIG. 34, an auxiliary conductor patch 10 may be provided in a position overlapping both the conductor patch 4 capacitively coupled to the microstrip line 7, and the microstrip line 7. The auxiliary conductor patch 10 is provided within a layer different from the layer the microstrip line 7 and the conductor patch 4 is formed. A first capacitance is formed between the auxiliary conductor patch 10 and the microstrip line 7, and a second capacitance is formed between the auxiliary patch 10 and the conductor patch 4. That is, a capacitance that connects the first capacitance and the second capacitance in series by providing the auxiliary conductor patch 10 is provided in parallel with the capacitances formed between the microstrip line 7 and the conductor patch 4. For this reason, it is possible to easily match the impedance of the microstrip line 7 with the antenna by changing the size or the layout of the auxiliary conductor patch 10.

Meanwhile, the coplanar line 11 shown in FIG. 25 is also capacitively coupled to the unit structure located at the outside, whereby power may be fed to the antenna.

The antenna of the invention can be easily manufactured by a general process used in manufacturing the printed board or the device package board. In addition, it is also possible to provide the antenna of the invention in the semiconductor device, for example, including silicon, using a micro interconnect process and the like used in a semiconductor technique.

Sixth Embodiment

Next, the antenna according to a sixth embodiment of the invention will be described. As shown in FIG. 20, the dispersion relation of the CRLH transmission line in the fifth embodiment has a bandgap between the right-handed band and the left-handed band, that is, in the frequency band from 4.9 GHz to 9.3 GHz. This is because there is a gap in the resonance frequency of the series impedance Z that defines the lower limit frequency of the right-handed band and the resonance frequency of the admittance Y that defines the upper limit frequency of the left-handed band, in the equivalent circuit diagram shown in FIG. 4.

When the bandgap is present in the dispersion relation of the CRLH transmission line, it is known that the Bloch impedance of the CRLH transmission line has precipitous frequency dependence. Hence, when there is a bandgap, it is difficult to obtain wideband impedance matching with the power feed line. For this reason, it is preferable to design the CRLH transmission line brought into operation as a portion of the antenna so as to satisfy the condition (referred to as the balance conditions) of causing the bandgap to disappear by causing the resonance frequencies of the admittance Y and the series impedance Z to be coincident with each other.

Figure 26:
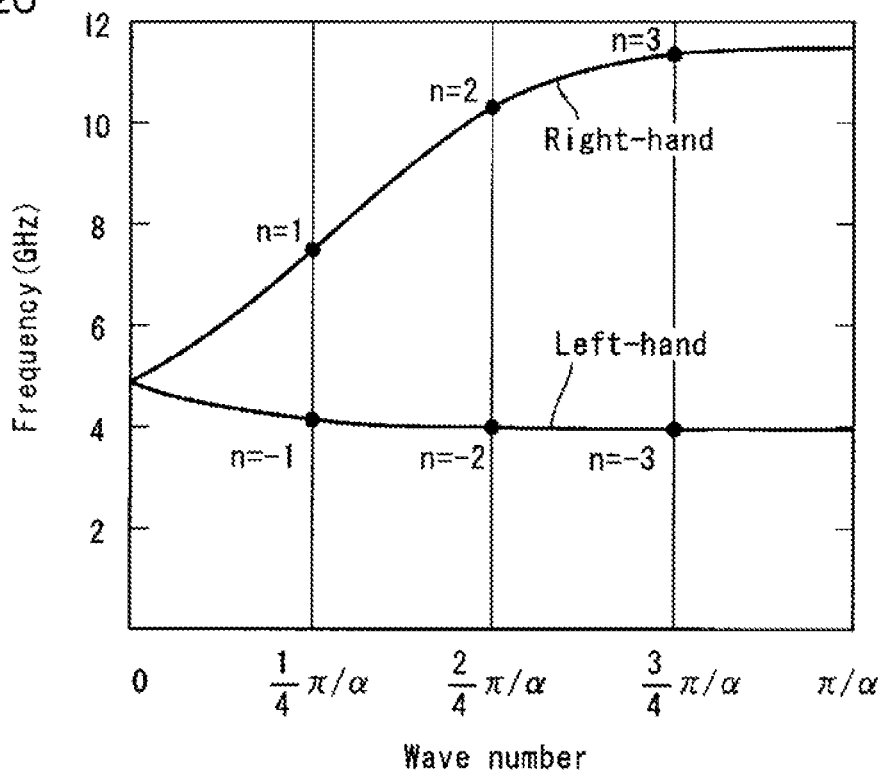
FIG. 26 is a diagram illustrating an example of the dispersion relation of the CRLH transmission line satisfying balance conditions.

FIG. 26 is a graph illustrating an example of the dispersion relation of the CRLH transmission line designed so as to satisfy the balance conditions. As shown in FIG. 26, when the transmission line is designed so as to satisfy the balance conditions, the bandgap is caused to disappear and thus the right-handed band and the left-handed band are connected to each other. In order to satisfy the balance conditions, it is preferable to shift the resonance frequency of the series impedance Z to a lower frequency by increasing CL which is a capacitance between two conductor patches 4 adjacent to each other.

Figure 27:
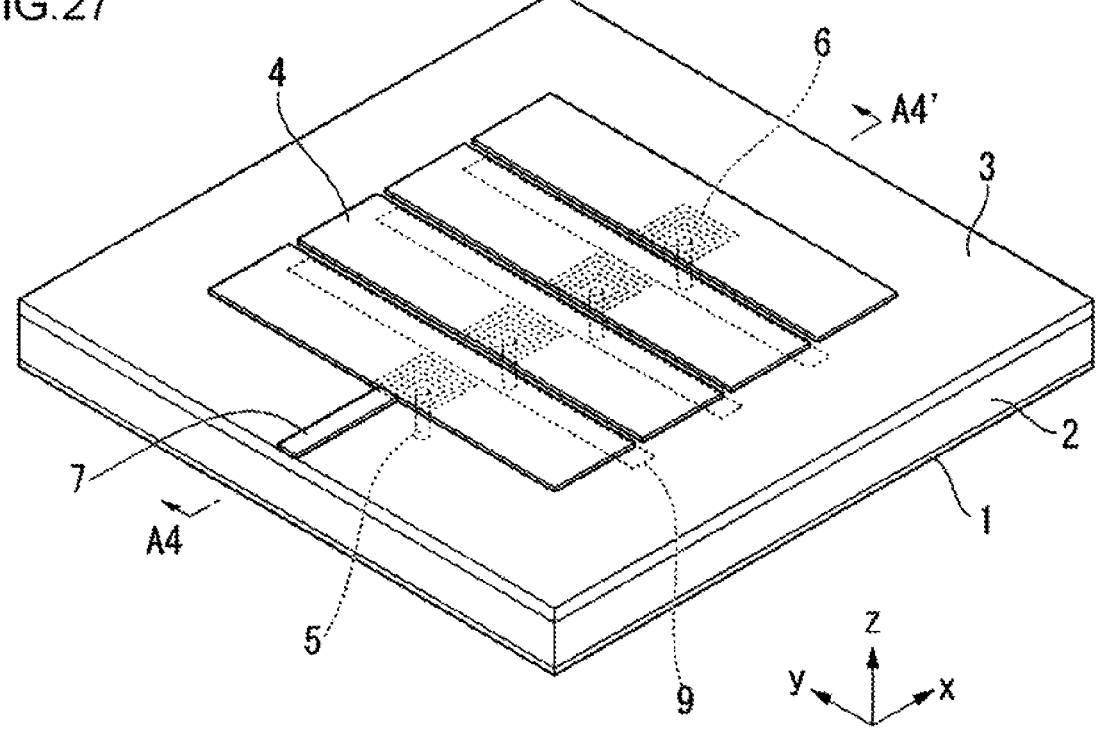
FIG. 27 is a perspective view illustrating the antenna according to a sixth embodiment.
Figure 28:
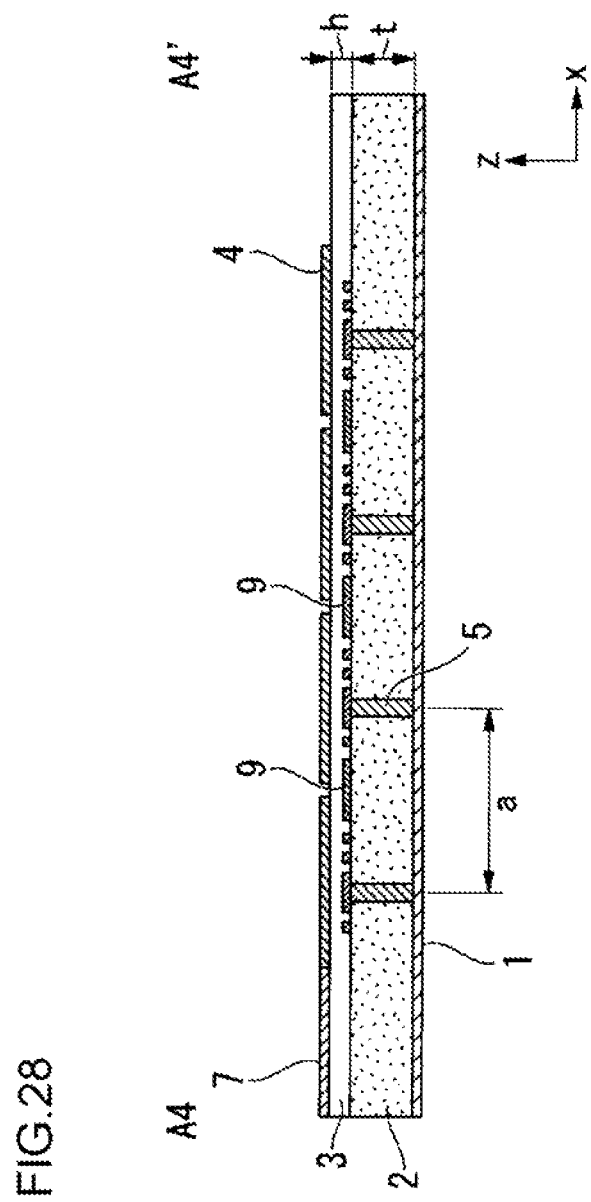
FIG. 28 is a cross-sectional view illustrating the antenna according to the sixth embodiment.

FIG. 27 is a perspective view illustrating the antenna according to the sixth embodiment of the invention. FIG. 28 is a cross-sectional view taken along the A4-A4' line of FIG. 27. As shown in FIGS. 27 and 28, the antenna according to the sixth embodiment has a configuration in which an auxiliary conductor patch 9 is added to the antenna according to the fifth embodiment. The auxiliary conductor patch 9 is provided on a layer interposed between the lower dielectric 2 and the upper dielectric 3, that is, on the same layer as the layer having the transmission line 6 provided thereon. The auxiliary conductor patch 9 is disposed so as to overlap two conductor patches 4 adjacent to each other in the Z-axis direction. The auxiliary conductor patch 9 is rectangular in planar shape, and the long side direction thereof is coincident with the long side direction of the conductor patch 4.

In the antenna according to the sixth embodiment, the capacitance coupling through the auxiliary conductor patch 9 is connected in parallel with the direct capacitance coupling between two conductor patches 4 adjacent to each other. Therefore, it is possible to easily increase CL which is a capacitance between two conductor patches 4, and to easily design the CRLH transmission line that satisfies the balance conditions.

Meanwhile, in the sixth embodiment, although the case in which the auxiliary conductor patch 9 is rectangular in shape is exemplified, the shape is not particularly limited as far as the electrical capacitance is formed by overlapping two conductor patches 4 adjacent to each other, and the shape of the auxiliary conductor patch 9 can be appropriately modified.

In addition, in the sixth embodiment, although the configuration is exemplified in which the auxiliary conductive patch 9 is provided on the same layer as the layer having the transmission line 6 having provided thereon, the configuration is not particularly limited as far as the electrical capacitance is formed by overlapping two conductor patches 4 adjacent to each other, and the auxiliary conductive patch 9 may be provided on the layer different from the layer having the transmission line 6 provided thereon. In addition, in the structural body according to the first to fourth embodiments, the auxiliary conductive patch 9 can also be provided.

Seventh Embodiment

Figure 29:
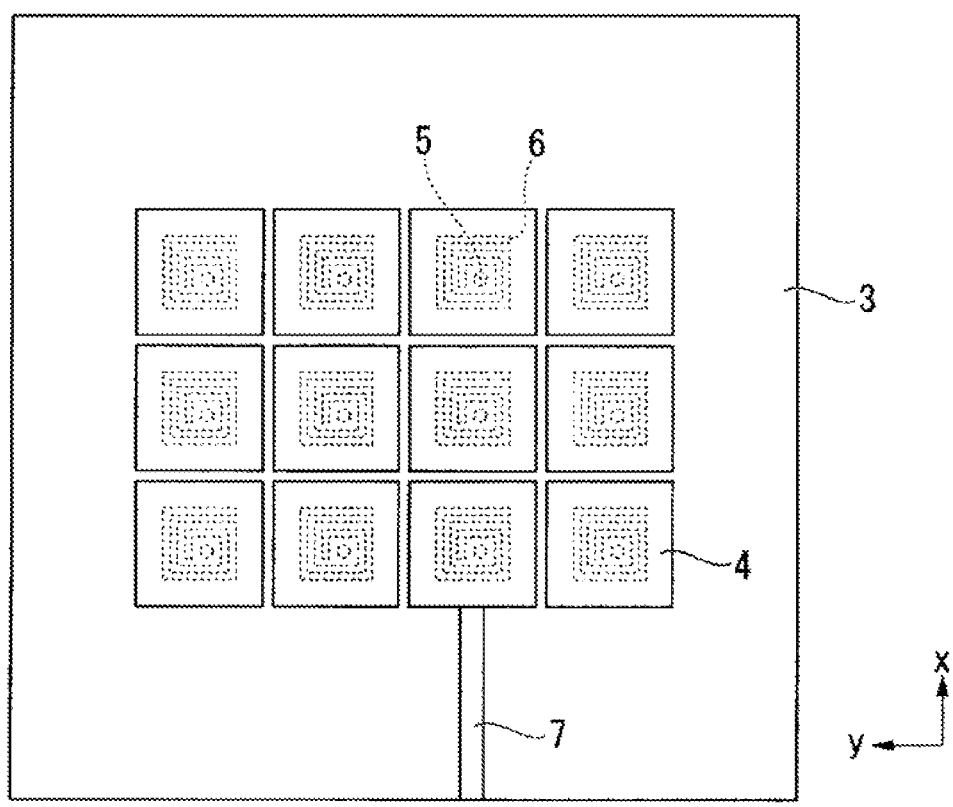
FIG. 29 is a plan view illustrating the antenna according to a seventh embodiment.
Figure 30:
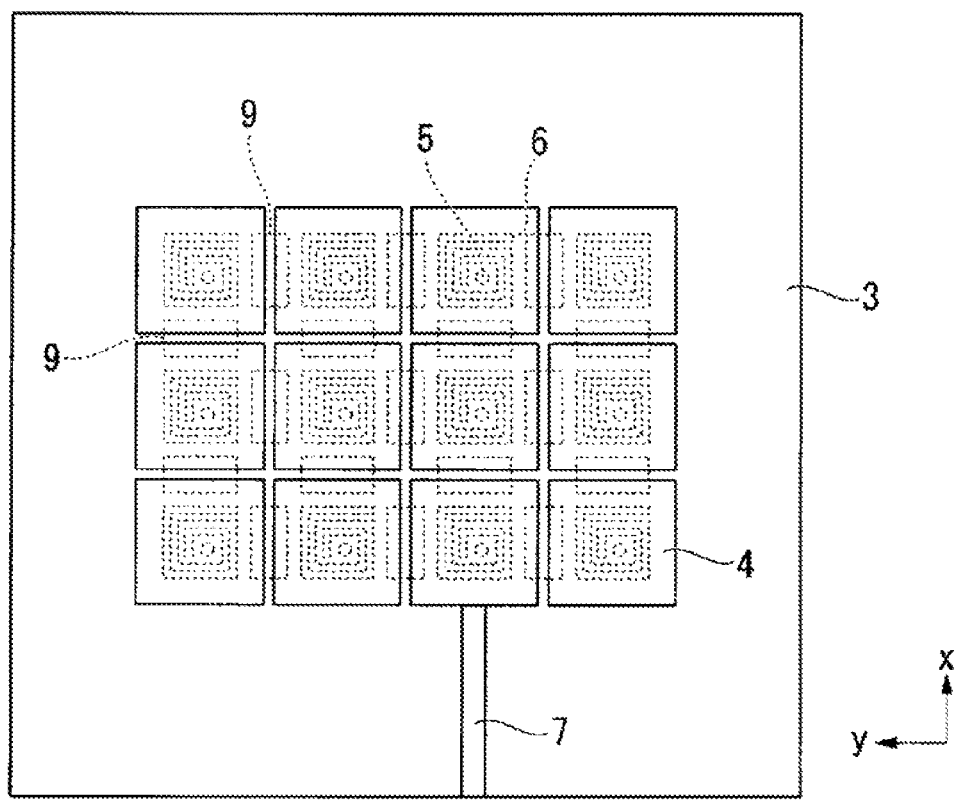
FIG. 30 is a plan view illustrating the antenna according to a modified example of the seventh embodiment.
Figure 31:
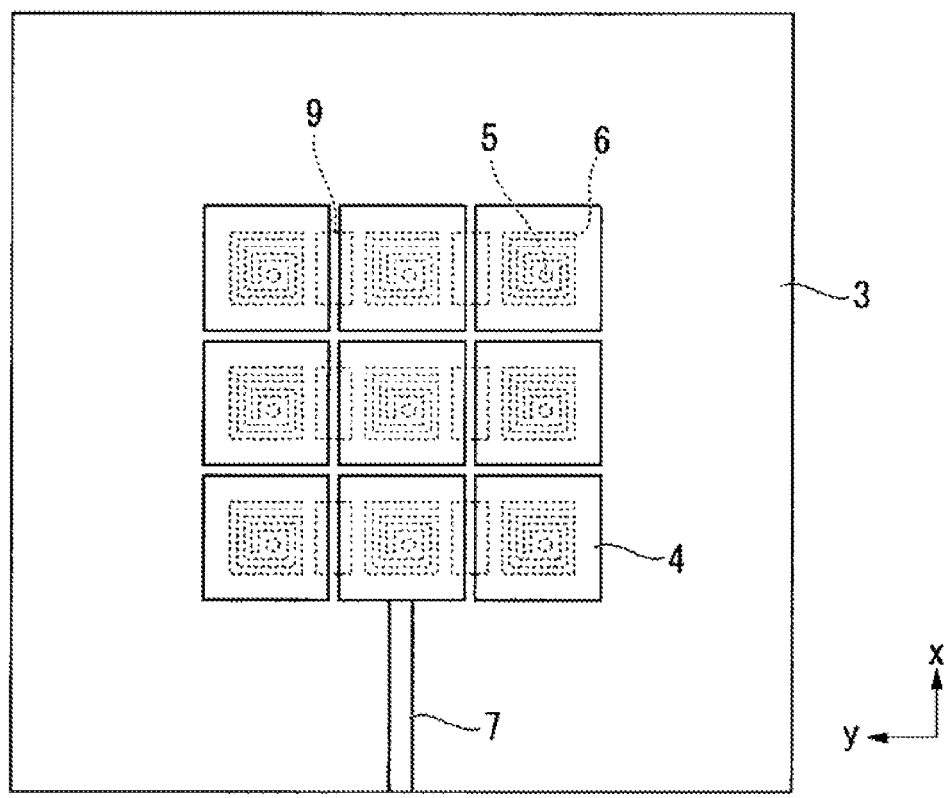
FIG. 31 is a plan view illustrating the antenna according to the modified example of the seventh embodiment.

Next, the antenna according to a seventh embodiment of the invention will be described. FIG. 29 is a plan view when the antenna according to the seventh embodiment is seen from the z-axis forward direction. FIGS. 30 and 31 are respectively plan views when the antenna according to a modified example of the seventh embodiment of the invention is seen from the z-axis forward direction.

The antenna according to the seventh embodiment is different from the antenna according to the fifth and sixth embodiments from the viewpoint that the unit structure is periodically arranged two-dimensionally. Here, the conductor patch 4 is square in shape, and three unit structures are arranged in the x-axis direction, and four unit structures are arranged in the y-axis direction. In the antenna according to the seventh embodiment, since The CRLH transmission lines having a different line length L are formed in the x-axis direction and the y-axis direction, the frequencies in which the half-wavelength resonance is generated are different from each other in the x-axis direction and the y-axis direction. Thereby, the antenna according to the seventh embodiment is configured to function as a dual band antenna or a multiband antenna.

Meanwhile, as shown in FIG. 30, the auxiliary conductor patch 9 described in the sixth embodiment may be provided in the antenna according to the seventh embodiment. The auxiliary conductor patch 9 is provided in the antenna shown in FIG. 30, respectively, between two conductor patches 4 adjacent to each other in the x-axis direction and between two conductor patches 4 adjacent to each other in the y-axis direction. In the antenna having such a configuration, it is possible to easily increase the capacitance between the conductor patches 4 adjacent to each other, and to easily realize a dual band antenna or a multiband antenna that satisfy the balance conditions of the CRLH line.

In addition, the auxiliary conductor patch 9 may be provided only between the conductor patches 4 adjacent to each other in the x-axis direction or conductor patches 4 adjacent to each other in the y-axis direction. In the antenna shown in FIG. 31, three unit structures are arranged in the x-axis direction, and three unit structures are arranged in the y-axis direction. The auxiliary conductor patch 9 is provided between the two conductor patches 4 adjacent to each other in the y-axis direction. In the antenna having such a configuration, since the auxiliary conductor patch 9 is provided only in the y-axis direction, the dispersion relation of the CRLH transmission line shows anisotropy in the x-axis direction and the y-axis direction. That is, although the unit structures are symmetrically arranged in the x-axis direction and the y-axis direction, the frequencies in which the half-wavelength resonance is generated are different from each other in the x-axis direction and the y-axis direction. Thereby, the antenna shown in FIG. 31 can be used as a dual band antenna or a multiband antenna.

Meanwhile, although the configuration in which the auxiliary conductor patch 9 is provided only in the y-axis direction is exemplified in FIG. 31, the auxiliary conductor patch 9 may be of course provided only in the x-axis direction. In addition, the sizes of the auxiliary conductor patch 9 may be made different from each other, for example, in the x-axis direction and the y-axis direction so that the dispersion relation has anisotropy in the x-axis direction and the y-axis direction. Although the case in which the microstrip line 7 is used as the power feeding portion is shown in FIGS. 29 and 30, it is also possible to use the coplanar line 11 shown in FIG. 25 or other power feeding portions.

Eighth Embodiment

Figure 32:
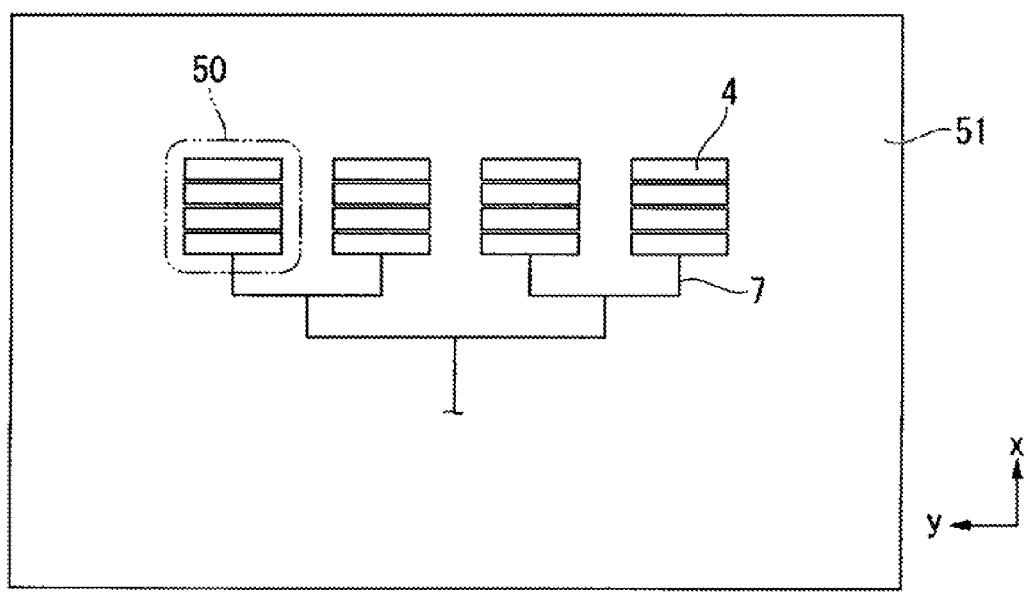
FIG. 32 is a plan view illustrating the antenna according to an eighth embodiment.

Next, an array antenna according to an eighth embodiment of the invention will be described. FIG. 32 is a plan view schematically illustrating a configuration of the array antenna according to the eighth embodiment. As shown in FIG. 32, the array antenna according to the eighth embodiment has a configuration in which a plurality of array elements 50 is arranged in a printed board 51 using the antenna according to the invention as an array element 50. Here, the antenna described in the fifth embodiment is adopted as the array element 50, and four array elements 50 are arranged one-dimensionally. The array element 50 is connected in parallel by the microstrip line 7.

In the array antenna according to the eighth embodiment, directionality becomes a beam shape, and an antenna gain in the beam direction can be increased. Meanwhile, it is of course possible to use the antenna according to other embodiments of the invention as the array element 50. In addition, the beam is further sharpened by increasing the number of array elements 50, and thus the gain in the beam direction can be increased.

Meanwhile, the structural body, the printed board, the antenna, the transmission line waveguide converter, and the array antenna which are shown in each of the embodiments mentioned above are used as a portion of the electronic device.

Priority is claimed on Japanese Patent Application No. 2009-111438, filed Apr. 30, 2009, the content of which is incorporated herein by reference.

The invention claimed is:

1. A structural body comprising:
   a first conductor; and
   a plurality of unit cells, each unit cell comprising:
      a second conductor, which is provided on a different layer from that of the first conductor, of which at least a portion is facing the first conductor; and
      a transmission line, having an open end, which is disposed between the first conductor and the second conductor, electrically connected to the first conductor through a conductor connection portion and provided facing the second conductor,
   wherein the open end is located inside an area between the first conductor and the second conductor.

2. The structural body according to claim 1, wherein the unit cells are repeatedly disposed.

3. The structural body according to claim 1, wherein the first conductor is common to plurality of unit cells which are repeatedly disposed.

4. The structural body according to claim 1, wherein a surface area of the first conductor is different from a surface area of the second conductor in a planar view.

5. The structural body according to claim 1, wherein the first conductor is a return path of the transmission line.

6. The structural body according to claim 1, wherein the surface of the second conductor facing the first conductor is in parallel to the surface of the first conductor facing the second conductor.

7. The structural body according to claim 1, further comprising a dielectric layer disposed between a conductor of the first conductor and the second conductor and the transmission line,
   wherein the conductor connection portion is a conductor via provided through the dielectric layer.

8. The structural body according to claim 1, further comprising a dielectric layer disposed between a conductor, of the first conductor and the second conductor, and the transmission line, and a second dielectric layer disposed between another conductor, of the first conductor and the second conductor, and the transmission line,
   wherein an opening is provided in the other conductor, and the conductor connection portion is a conductor via provided through the dielectric layer and the second dielectric layer, and a portion thereof is disposed within the opening and is not in contact with the other conductor.

9. The structural body according to claim 1, wherein the unit structure is periodically disposed one-dimensionally or two-dimensionally on the plane surface parallel to the first conductor.

10. The structural body according to claim 1, wherein the transmission line is provided two-dimensionally on the surface facing the first conductor, and the planar shape of the transmission line is a spiral shape.

11. The structural body according to claim 1, wherein the transmission line is provided two-dimensionally on the surface facing the first conductor plane, and the planar shape of the transmission line is a meandering shape.

12. The structural body according to claim 1, wherein the transmission line comprises a plurality of ends, and at least one of the plurality of ends is electrically connected to the conductor connection portion.

13. The structural body according to claim 1, wherein the transmission line comprises a branch portion and branch lines mutually branched from the branch portion, and the line lengths of the branch lines are different from each other.

14. The structural body according to claim 1, wherein the unit structure comprises a bandgap in a dispersion relation of the frequency to the wave number or the wavelength of electromagnetic waves incident on the unit structure, and a portion of an electromagnetic bandgap structure is formed by the unit structure.

15. A printed board comprising the structural body according to claim 1.

16. The printed board according to claim 15, wherein a reflective plate is formed by the structural body.

17. The printed board according to claim 16, wherein a plurality of devices is provided in the printed board, and the structural body is provided so as to block at least one propagation path of electromagnetic waves between at least two devices of the plurality of devices.

18. The printed board according to claim 15, wherein a power feeding portion that supplies an electrical signal is provided in at least one unit structure constituting the structural body.

19. An antenna comprising the structural body according to claim 1.

20. The antenna according to claim 19, wherein a reflective plate is formed by the structural body.

21. The antenna according to claim 19, wherein a power feeding portion that supplies an electrical signal is provided in at least one unit structure.

22. The antenna according to claim 20, wherein a plurality of unit structures is repeatedly disposed, and
the unit structures comprise at least one auxiliary conductor which is provided on a plane surface different from a plane surface having the second conductor provided thereon, and is disposed so as to overlap two of the second conductors adjacent to each other.

23. The antenna according to claim 22, wherein the auxiliary conductor is disposed on the same plane surface as the plane surface having the transmission line disposed thereon.

24. The antenna according to claim 21, wherein the power feeding portion is provided on the same plane surface as the plane surface having the first conductor provided thereon, and is electrically connected to the first conductor.

25. The antenna according to claim 21, wherein the power feeding portion comprises a coplanar line which is provided on the same plane surface as the plane surface having the one conductor provided thereon and is connected to any one of the conductor connection portions.

26. A transmission line waveguide converter comprising the structural body according to claim 1 as a reflective plate.

27. An array antenna configured by disposing a plurality of array elements in the same plane surface, each of the array element is an antenna according to claim 20.

28. An electronic device comprising the structural body according to claim 1.

29. An electronic device comprising the printed board according to claim 15.

30. An electronic device comprising the antenna according to claim 19.

31. An electronic device comprising the transmission line waveguide converter according to claim 26.

32. An electronic device comprising the array antenna according to claim 27.

* * * * *